(12) United States Patent
Kim et al.

(10) Patent No.: US 11,735,330 B2
(45) Date of Patent: Aug. 22, 2023

(54) SILVER NANOWIRE-MESH (AG NW-MESH) ELECTRODE AND MANUFACTURING METHOD THEREOF

(71) Applicant: KOREA INSTITUTE OF SCIENCE AND TECHNOLOGY, Seoul (KR)

(72) Inventors: Sang Woo Kim, Seoul (KR); Seong Jun Kim, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 25 days.

(21) Appl. No.: 17/329,151

(22) Filed: May 25, 2021

(65) Prior Publication Data
US 2022/0051829 A1  Feb. 17, 2022

(30) Foreign Application Priority Data
Aug. 13, 2020 (KR) .................. 10-2020-0101973

(51) Int. Cl.
*H01B 1/02* (2006.01)
*B23K 26/34* (2014.01)
*G21F 1/12* (2006.01)
*H01B 1/16* (2006.01)
(Continued)

(52) U.S. Cl.
CPC ............... *H01B 1/02* (2013.01); *B23K 26/34* (2013.01); *G21F 1/12* (2013.01); *H01B 1/16* (2013.01); *H05K 1/0296* (2013.01); *H05K 3/027* (2013.01); *H05K 2201/0108* (2013.01); *H05K 2201/026* (2013.01)

(58) Field of Classification Search
CPC .. H01B 1/02; H01B 1/16; B23K 26/34; G21F 1/12; H05K 1/0296; H05K 3/027; H05K 2201/0108; H05K 2201/026
USPC ......................................................... 174/257
See application file for complete search history.

(56) References Cited

U.S. PATENT DOCUMENTS

| 8,974,900 | B2* | 3/2015 | Eckert .................. C09D 101/14 |
| | | | 977/762 |
| 9,236,162 | B2* | 1/2016 | Suganuma ......... H01B 13/0036 |
| 9,254,505 | B2* | 2/2016 | Connor .................. B82Y 30/00 |

(Continued)

FOREIGN PATENT DOCUMENTS

| JP | 2012-80091 A | 4/2012 |
| JP | 2017-535930 A | 11/2017 |

(Continued)

OTHER PUBLICATIONS

Korean Office Action for KR Application No. 10-2020-0101973 dated Apr. 19, 2022.

*Primary Examiner* — Timothy J Thompson
*Assistant Examiner* — Michael F McAllister
(74) *Attorney, Agent, or Firm* — Cantor Colburn LLP

(57) ABSTRACT

According to one aspect of the present invention, a silver nanowire mesh (Ag NW-mesh) electrode and a fabricating method thereof. The Ag NW-mesh electrode includes a flexible substrate; and a mesh pattern layer which is disposed on the flexible substrate and in which a plurality of first meal lines and a plurality of second metal lines are composed of Ag NWs and intersect each other in an orthogonal or diagonal direction to form a grid pattern, wherein the first metal lines and the second metal lines of the mesh pattern layer form an angle of 35 degrees to 55 degrees with respect to a bending direction.

15 Claims, 45 Drawing Sheets

(51) Int. Cl.
*H05K 3/02* (2006.01)
*H05K 1/02* (2006.01)

(56) References Cited

U.S. PATENT DOCUMENTS

| | | | | |
|---|---|---|---|---|
| 10,254,786 | B2* | 4/2019 | Dodds | G06F 3/041 |
| 10,831,327 | B2* | 11/2020 | Ogumi | G06F 3/0446 |
| 10,895,794 | B2* | 1/2021 | Magdassi | G02F 1/1524 |
| 11,169,649 | B2* | 11/2021 | Kim | G06F 3/0412 |
| 11,343,911 | B1* | 5/2022 | Kambe | G06F 3/041 |
| 2009/0130433 | A1* | 5/2009 | Takada | H01B 1/22 428/401 |
| 2009/0218310 | A1* | 9/2009 | Zu | H05K 1/032 216/11 |
| 2009/0293268 | A1* | 12/2009 | Carmi | H05B 3/84 29/829 |
| 2014/0202742 | A1* | 7/2014 | Jones | H01L 31/1884 174/253 |
| 2015/0038033 | A1* | 2/2015 | Gaynor | G06F 3/0446 442/52 |
| 2015/0378461 | A1* | 12/2015 | Hashimoto | G06F 1/16 428/461 |
| 2016/0018348 | A1* | 1/2016 | Yau | G06F 3/0443 324/697 |
| 2016/0132153 | A1* | 5/2016 | Lin | G06F 3/0446 345/174 |
| 2016/0198571 | A1* | 7/2016 | Park | H05K 3/0014 174/251 |
| 2016/0282989 | A1* | 9/2016 | Hirakata | G06F 3/0446 |
| 2016/0293289 | A1* | 10/2016 | Stockum | H01L 51/0023 |
| 2017/0157670 | A1* | 6/2017 | Choi | B22F 9/24 |
| 2017/0241039 | A1* | 8/2017 | Takai | C25D 5/022 |
| 2017/0251553 | A1* | 8/2017 | Zhang | H05K 3/027 |
| 2018/0134908 | A1* | 5/2018 | Zhang | C09D 11/14 |
| 2019/0091970 | A1* | 3/2019 | Ueki | B32B 27/365 |
| 2020/0241664 | A1* | 7/2020 | Lee | G06F 3/0416 |
| 2021/0026473 | A1* | 1/2021 | Kim | G06F 3/04164 |
| 2021/0095143 | A1* | 4/2021 | Zhu | B41M 1/10 |
| 2022/0377887 | A1* | 11/2022 | Grossman | H05K 1/097 |

FOREIGN PATENT DOCUMENTS

| | | |
|---|---|---|
| KR | 10-2017-0073832 A | 6/2017 |
| WO | 2012/033103 A1 | 3/2012 |

* cited by examiner

SILVER NANOWIRE-MESH (AG NW-MESH) ELECTRODE AND MANUFACTURING METHOD THEREOF

CROSS-REFERENCE TO RELATED APPLICATION(S)

This application claims the benefit under 35 USC § 119A of Korean Patent Application No. 10-2020-0101973, filed on Aug. 13, 2020, in the Korean Intellectual Property Office, the entire disclosure of which is incorporated herein by reference for all purposes.

BACKGROUND

1. Field

The following description relates to a silver nanowire-mesh (Ag NW-mesh) electrode and a manufacturing method thereof, and more particularly, to an Ag NW-mesh electrode fabricated using selective laser welding and having high flexibility, and a manufacturing method thereof.

2. Description of Related Art

Transparent conducting electrodes (TCEs), which are widely used in various optoelectronic devices, such as, liquid crystal displays (LCDs), organic light emitting diodes (OLEDs), touch screens, and organic solar cells (OSCs), have been developed rapidly. Recently, as the demand for wearable devices increases, extensive efforts have been made to develop a mechanically flexible transparent electrode having high transmittance and electrical conductivity. Thus, there is a need for flexible TCEs having high bending resistance in an environment where cyclic structural deformation occurs.

A transparent indium tin oxide (ITO) electrode has been applied in conventional optoelectronic devices owing to its high optical transmittance (>90%), low sheet resistance (<50Ω/□), and high work stability. However, the ITO electrode is fragile and easily cracked due to the stiffness attributed to ionic bonding, making itself unsuitable for flexible devices. Therefore, several conductive materials to replace ITO electrodes, including graphene, carbon nanotubes, conductive polymers, metal nanowires, and metal meshes have been developed.

However, conductive polymers and carbon-based transparent electrodes are still less than the requirements in terms of conductivity and electrical stability required for highly flexible electronic devices, and they do not have sufficient performance to replace ITO. Yet, metal-based transparent electrodes, such as random networks of metal nanowires and a metal mesh, have relatively excellent conductivity and transmittance and also show excellent mechanical stability.

Among the transparent electrodes of metal nanowires, especially silver nanowires (Ag NWs) have been extensively studied. Numerous studies on Ag NWs have been conducted due to their high transmittance, low sheet resistance, and excellent flexibility. However, Ag NWs have a limited contact area and due to the conductive capping agent the contact resistance between random networks is increased, undesirably lowering conductivity. In addition, the generation of haze due to light scattering, which is characteristics of random network-based materials, and weak adhesion between a flexible substrate and nanowires cause bending fatigue deformation under bending stress. Increasing the number of nanowires deposited on a substrate by raising the concentration of the nanowires may increase the number of connected networking points between the nanowires and thus increase the contact area, but degrades the optical properties significantly. In order to overcome these problems, methods using plasma welding, photonic sintering, high temperature sintering, and mechanical pressing have been developed. Recently, wet sintering using a roll-to-roll process has been suggested as a solution to these problems. However, despite these efforts, a polymer substrate (PET or PEN) is still subject to deformation due to excessive heat produced in the process, and bending durability under a cyclic bending stress environment is low, and thus improvement is needed.

On the other hand, the metal mesh has a larger contact area than the metal nanowires, and has better optical transmittance and lower sheet resistance than the nanowires. In addition, the line width, line distance, and various patterns may be used without limitations and be varied according to the purpose. However, the metal mesh has lower flexibility than nanowires due to the nature of the material, and requires high fabrication cost and long processing time.

Metal mesh fabrication methods recently used include photolithography, nanoimprinting, offset printing, and electrohydrodynamic (EHD) jet printing. Photolithography requires a mask process and an etching process, and nanoimprinting requires a master mold, which makes the fabrication process complex. Therefore, there has been an attempt to develop offset printing that may enable mass-production, yet the fabrication is carried out with the fixed line width and line distance of a roller, and it is difficult to control them for characteristic change. Also, the fabrication is conducted in a contact manner, which may result in uneven particle delivery. EHD jet printing enables non-contact fabrication, but has drawbacks in that high voltage must be used, nozzle clogging occurs, and output is slow.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The present invention aims to provide a silver nanowire mesh (Ag NW-mesh) electrode with very high bending durability fabricated via selective laser welding in order to solve the drawbacks of the above metal nanowires and the existing metal mesh.

According to one aspect of the present invention, a silver nanowire-mesh (Ag NW-mesh) electrode is provided. The Ag NW-mesh electrode may include a flexible substrate and a mesh pattern layer which is disposed on the flexible substrate and in which a plurality of first meal lines and a plurality of second metal lines are composed of Ag NWs and intersect each other in an orthogonal or diagonal direction to form a grid pattern, wherein the first metal lines and the second metal lines of the mesh pattern layer form the angle of any one of 35 degrees to 55 degrees, 125 degrees to 145 degrees, 215 degrees to 235 degrees and 305 degrees to 325 degrees with respect to a bending direction.

In one embodiment, the first metal lines and the second metal lines may be metal lines having the same line width and may have a line width in the range of 8 μm to 14 μm.

In one embodiment, the silver nanowire-mesh electrode may further include a polyurethane (PU) overcoat layer formed on the mesh pattern layer.

In one embodiment, in the mesh pattern layer, the Ag NWs may be bonded via selective laser welding to form a network.

In one embodiment, in the mesh pattern layer, the plurality of first metal lines may be arranged in parallel to each other at the same interval, and the plurality of second metal lines may be arranged in parallel to each other at the same interval.

In one embodiment, the flexible substrate may be a substrate of one polymer selected from a group consisting of polyimide (PI), polyethylene terephthalate (PET), polyethylene naphthalate (PEN), polyethersulfone (PES), nylon, polytetrafluoroethylene (PTFE), polyetheretherketone (PEEK), polycarbonate (PC), polyurethane (PU), and polyarylate (PAR).

In one embodiment, the first metal lines and the second metal lines have an area mass density (AMD) in the range of 70 mg/m$^2$ to 130 mg/m$^2$.

According to another aspect of the present invention, a method of fabricating an Ag NW-mesh electrode is provided. The method of fabricating an Ag NW-mesh electrode may include the steps of: A coating a silver nanowire solution on a substrate, B forming a mesh pattern layer on the substrate using selective laser welding, and C washing and drying the substrate on which the mesh pattern layer is formed.

In one embodiment, the method of manufacturing the silver nanowire-mesh electrode may further include D forming an overcoat layer by spin coating polyurethane (PU) on the mesh pattern layer.

In one embodiment, in the step B, energy density according to laser power and laser scan speed may be in the range of 0.5 J/cm$^2$ to 4.5 J/cm$^2$.

According to still another aspect of the present invention, a transparent electromagnetic wave shielding film including the Ag NW-mesh electrode is provided.

According to still another aspect of the present invention, a transparent heater including the Ag NW-mesh electrode is provided.

Other features and aspects will be apparent from the following detailed description, the drawings, and the claims.

Figure 1:
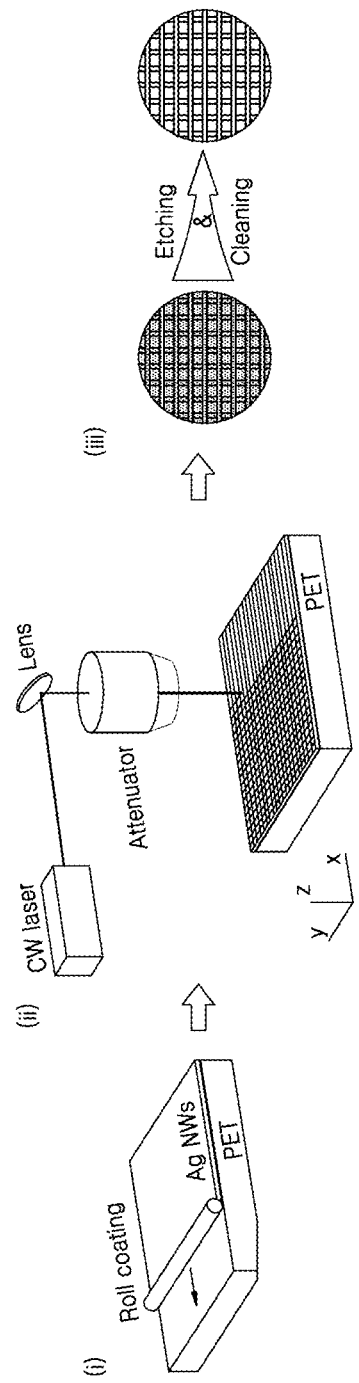
FIG. 1 is a schematic diagram of a selective laser welding (SLW) technique for fabricating a silver nanowire-mesh (Ag NW-mesh) transparent electrode according to an embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention.

The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Hereinafter, exemplary embodiments of the present invention will be described in detail with reference to the accompanying drawings in order to enable those of ordinary skill in the art to easily implement the present invention.

FIG. 1 shows a process of forming a transparent electrode with a mesh pattern through selective laser welding (SLW) according to an embodiment of the present invention.

Referring to (i) of FIG. 1, first, a solution in which silver nanowires (Ag NWs) and silver nanoparticles (Ag NPs) are dispersed is wet roll-coated on a PET substrate, and then (ii) a laser beam concentrated thereon is quickly radiated in a desired pattern. At this time, characteristics of a mesh pattern layer may be determined by adjusting the shape of the pattern, a mesh line width, and a line spacing. Local heat is selectively applied to surfaces of the Ag NWs and the Ag NPs by a laser, and the nanowires are arranged in a connected state so that a grid-like network may be formed on the substrate. Referring to (iii) of FIG. 1, portions where the nanowires and nanoparticles are not welded are separated through washing.

Figure 2:
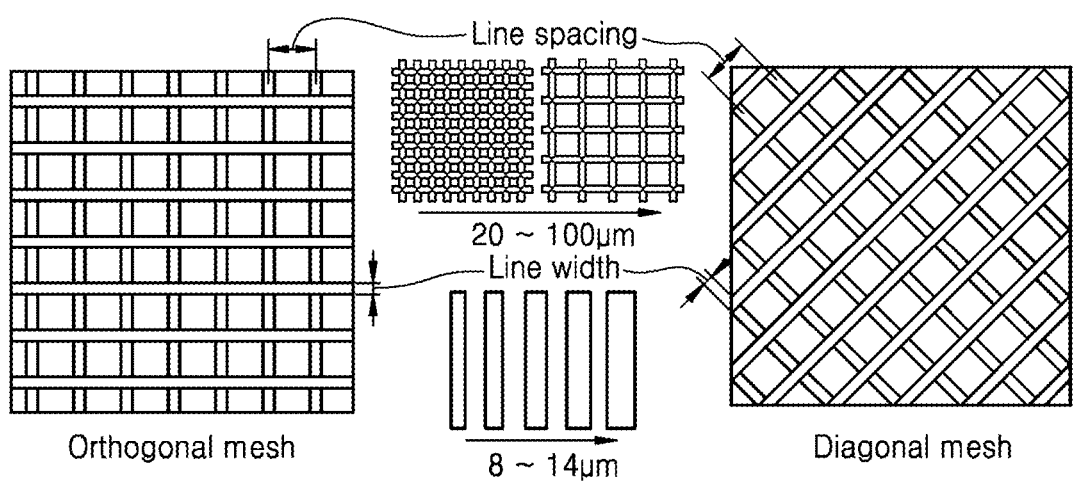
FIG. 2 shows grid-like mesh structures orthogonal and diagonal with respect to a bending stress direction and an Ag-NW-mesh electrode fabricated by adjusting mesh line width and line spacing in one example of the present invention.

FIG. 2 shows various mesh patterns formed by adjusting a pattern shape, a line width, and a line spacing in the formation of a mesh-patterned electrode according to an embodiment of the present invention.

A of FIG. 2 shows that a plurality of horizontal metal lines arranged parallel to each other with the same spacing and a plurality of vertical metal lines arranged parallel to each other with the same spacing form a lattice structure, B shows that a plurality of first metal lines extending in a diagonal direction and a plurality of second metal lines extending at an angle of 90 degrees with respect to the first metal lines intersect each other to form a rhombus-shaped lattice pattern. The first metal lines and the second metal lines are arranged diagonally to form the angle of any one of 35 degrees to 55 degrees, 125 degrees to 145 degrees, 215 degrees to 235 degrees and 305 degrees to 325 degrees, more preferably the angle of any one of 45 degrees, 135 degrees, 225 degrees and 315 degrees with respect to a bending direction of the electrode. When a pattern is formed in a diagonal direction by adjusting an angle in the direction in which the stress is concentrated in an environment of constant repeated bending to the angle of any one of 35 degrees to 55 degrees, 125 degrees to 145 degrees, 215 degrees to 235 degrees and 305 degrees to 325 degrees, bending durability may be greatly improved compared to an orthogonal pattern. The radiation path of the laser may be set so that only the desired shape and selected portions of the nanowires disorderly arranged on the substrate can be heat treated. At this time, it is also possible to improve mechanical durability by adjusting the line width and the line spacing.

In one embodiment, a protective film which covers an upper surface of the mesh pattern layer may be attached to improve durability of the mesh transparent electrode. For example, an overcoat layer may be further formed by spin coating polyurethane (PU) on a mesh electrode film. By doing so, it is possible to prevent the metal lines or the like from being exposed to the outside.

Figure 3:
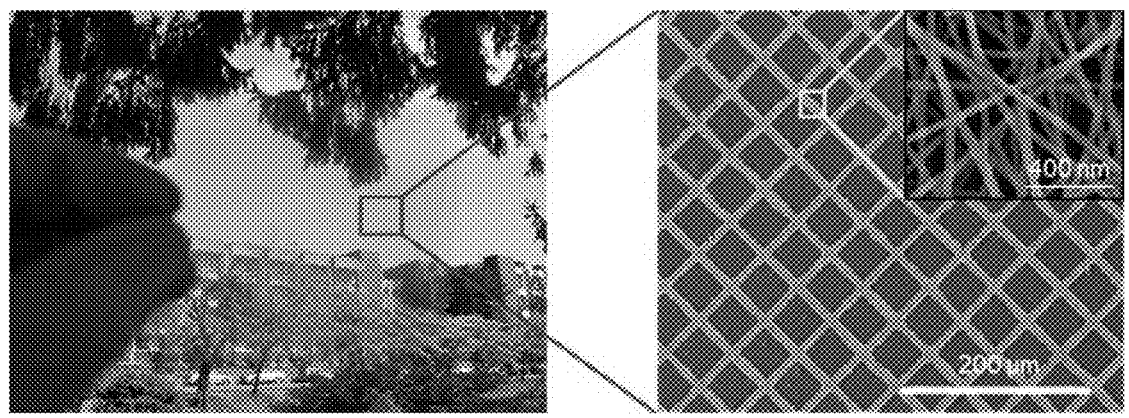
FIG. 3 shows an optical photograph and an enlarged scanning electron microscope (SEM) image of an Ag NW-mesh electrode with a transmittance of 85.5% according to an embodiment of the present invention.

FIG. 3 shows an optical photograph of an AG NW-mesh transparent electrode film prepared by the above method and an enlarged scanning electron microscope (SEM) image thereof. Nanowires are bonded by SLW to form a connected network structure, and excellent optical transmittance of the metal mesh may be confirmed. In electrodes having the same transmittance, the Ag NW-mesh may increase the bending durability because the number of network intersection points in the mesh lines is higher than that of a pristine Ag NWs of a typical random network structure. In order to further improve the bending durability of the Ag NWs under repeated bending stress in a predetermined direction, a plurality of metal lines may be arranged in a diagonal direction and intersect each other to form a lattice shape. In addition, if the line width is too small or too large, a damaged mesh line may be produced, so that the resistance change of a cyclic bending test may occur relatively quickly, and thus the line width may be in the range of 8 to 14 μm, preferably 9 to 10 μm.

In one embodiment, the mesh pattern layer may be formed on a substrate of one polymer selected from a group consisting of polyimide (PI), polyethylene terephthalate (PET), polyethylene naphthalate (PEN), polyethersulfone (PES), nylon, polytetrafluoroethylene (PTFE), polyetheretherketone (PEEK), polycarbonate (PC), and polyarylate (PAR).

According to another aspect of the present invention, an electronic device including the Ag NW-mesh transparent electrode film may be provided. The electronic device may include a touch screen, a liquid crystal display device, a transparent heater, a transparent transistor, a transparent electromagnetic wave shielding film, a transparent electrostatic protective film, a conductive glass, a gas sensor, heat reflective coating, a planar antenna for a communication device, an organic EL device, and a solar cell, but is not limited thereto.

Hereinafter, the present invention will be described in more detail with reference to the following examples. However, these examples are made only for illustrative purposes, and the present invention is not be construed as being limited to those examples.

EXAMPLES

Isopropyl alcohols (IPAs) containing Ag NWs and Ag NPs, respectively, were prepared. The diameter and length of Ag NWs were in the range of 18-24 nm and 17-27 μm, respectively, and the diameter of Ag NPs was in the range of 42-58 nm. The thickness of PET, which is a transparent flexible substrate, was 100 μm. A polyurethane (PU) rubber used as a curable elastomer to form a protective layer was of a two-part polyurethane rubber composed of a curing agent and a base resin, and each part contains each of methylene bis(4-cyclohexyl isocyanate) and polyester polyol. The Ag NWs (0.5-1 wt %) and the Ag NPs (10 wt %) were roll-coated on a PET film, and then an electrode film was dried on a hot plate at 50° C. for 10 minutes. After coating the PET with the Ag NWs and the Ag NPs, a continuous wave (CW) DPSS laser (wavelength=532 nm) beam was focused with a lens and irradiated onto a surface thereof. At this time, the focused laser beam was quickly scanned by a laser scanner, and a laser scanner system controlled detailed laser speed and power using computer software compatible with a design drawing generated through a CAD program. The coated electrode layer was selectively welded by localized heating due to the laser beam irradiation, and then was sonicated in ethanol for 3 minutes and washed with ethanol and toluene to clear the remaining unwelded portions. Subsequently, the film in the form of a mesh obtained by selective laser fusion was dried in a thermostatic drying chamber at 60° C. for 10 minutes.

An overcoat layer was formed to improve durability of the transparent mesh electrode, and before the overcoat layer was formed, external electrodes were formed with silver paste to connect with external connectors at both ends of the mesh electrode film. Polyurethane (PU) was spin coated on the mesh electrode film at a rotation speed of 2,000 rpm for 40 seconds. The PU coated mesh electrode film was dried at 80° C. for 6 hours in a thermostatic drying chamber. At this time, the thickness of the overcoat layer is approximately 20 μm.

Example 1

Figure 4A:
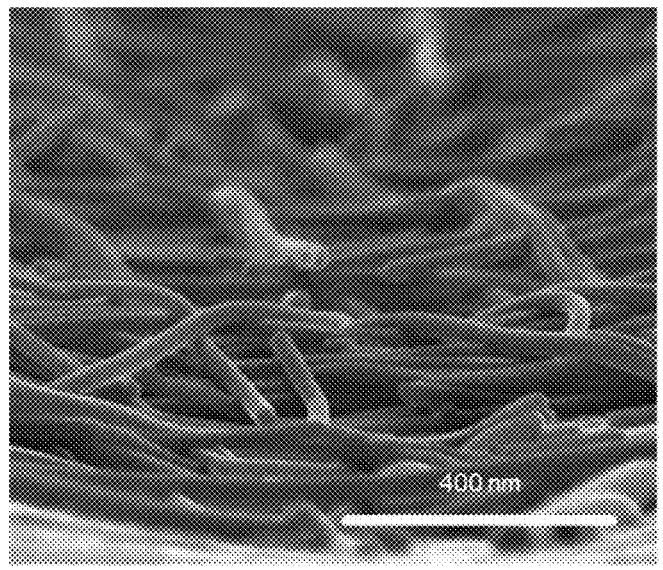
FIG. 4A to FIG. 4D show SEM and atomic force microscopy (AFM) images of silver nanowires (pristine Ag NWs) and networked Ag NWs before and after laser welding in one example of the present invention.
Figure 4B:
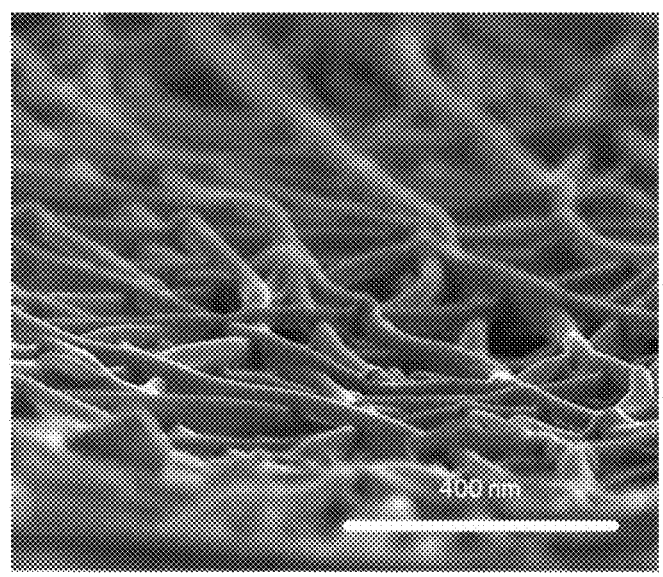
Figure 4C:
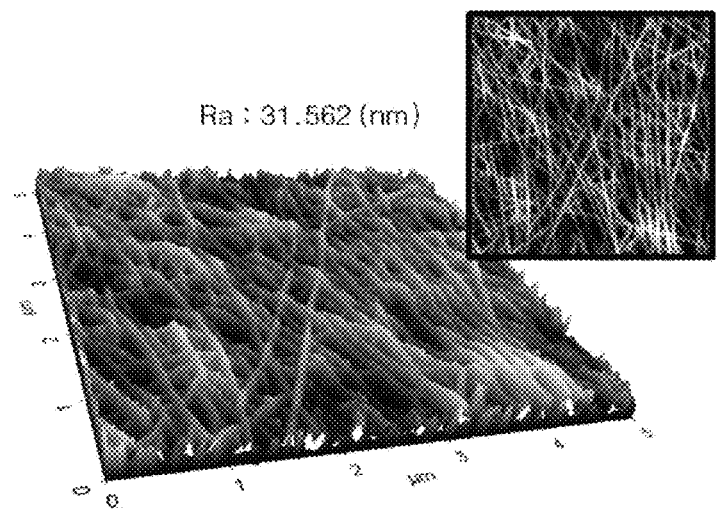
Figure 4D:
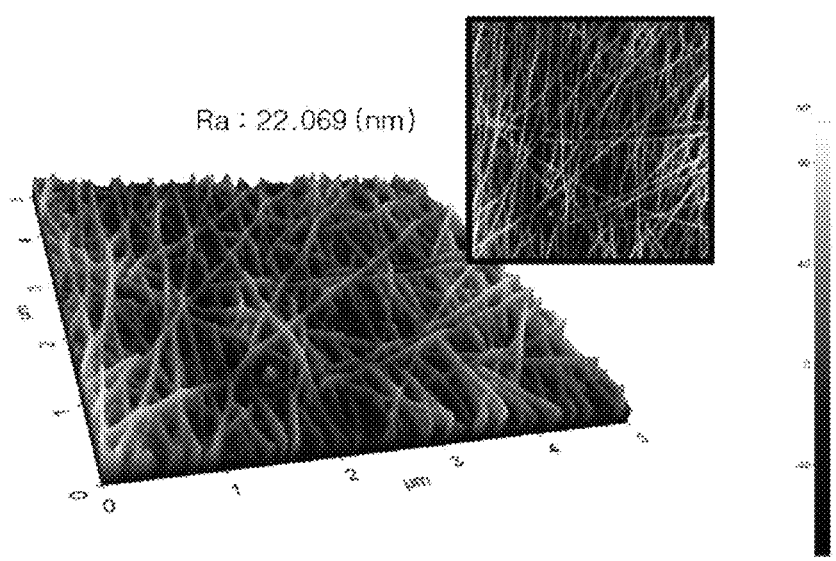

FIG. 4A to FIG. 4D show SEM images and atomic force microscopy 3-dimensional (AFM 3D) images of the nanowire network structure before and after laser fusion. As shown in FIG. 4A, in a pristine Ag NWs network before laser fusion, the Ag NWs were simply stacked and electrically weakly connected, which led to the increase in contact resistance and degradation of electrical characteristics. In addition, the mechanical characteristics were low due to a weak adhesion between the pristine Ag NWs network and the PET substrate. On the other hand, FIG. 4B shows a Ag NWs electrode in which nanowires were completely bonded by laser welding to form a network structure. Therefore, the electrical connection path of Ag NWs increased, and strong adhesion to the substrate was observed. FIG. 4C and FIG. 4D show surface 3D images and roughness of each Ag NWs. As shown in FIG. 4C and FIG. 4D, the roughness of Ag NWs before selective laser welding was 31.6 nm, and after laser welding, the roughness of Ag NWs was 22.1 nm, which is about 30% less than the surface roughness. Thus, the effect of welding of the nanowires through laser irradiation can be seen.

Example 2

Figure 5A:
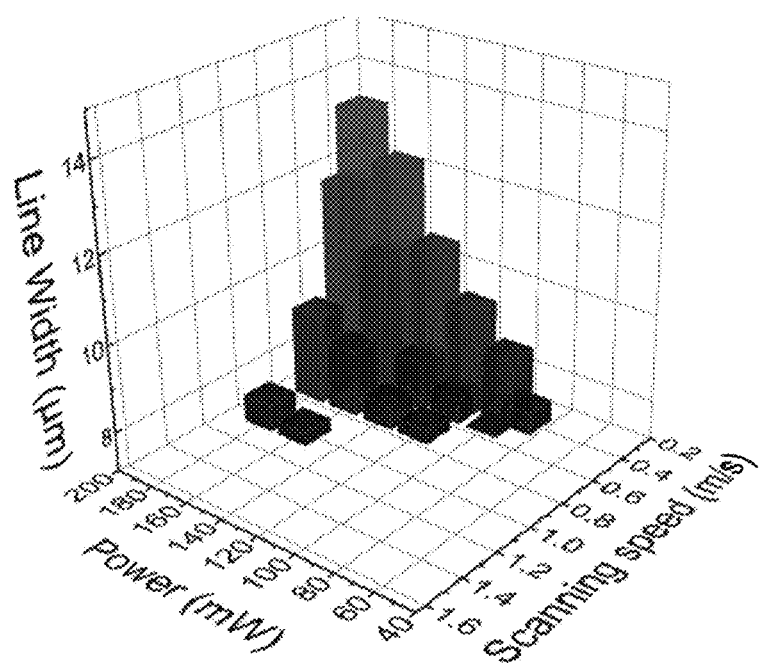
FIG. 5A to FIG. 5C present graphs showing changes in line width according to laser power and laser scan speed at each area mass density (AMD) in the progress of SLW in one example of the present invention.
Figure 5B:
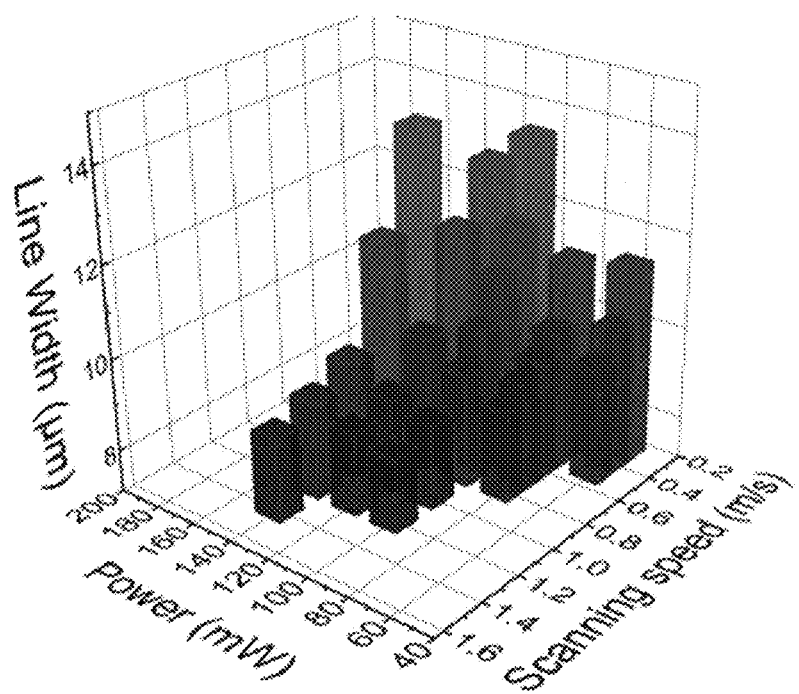
Figure 5C:
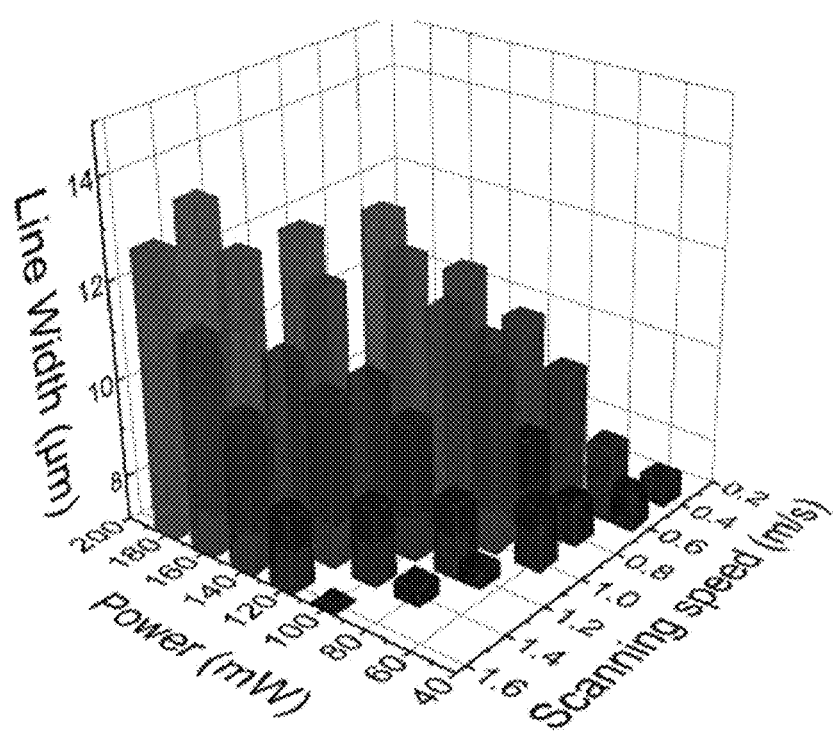

FIG. 5A to FIG. 5C present graphs showing changes in line width according to laser power and laser scan speed during SLW. Laser welding conditions varied according to the amount of pristine Ag NWs deposited on the substrate through a solution process before laser welding was performed. For a quantitative analysis of the number of nanowires forming a random network on the substrate, a description is made through area mass density (AMD). As AMD increases, the number of nanowires of a random network deposited on the substrate increases, which means that heat can be absorbed well, and accordingly, an Ag NW-mesh may be produced even at lower laser power and faster laser scan speed. That is, as the AMD increases, the usable range of laser conditions used to manufacture Ag NW-mesh is widened.

FIG. 5A to FIG. 5C are 3D graphs showing laser power and laser scan speed conditions of SLW for producing an Ag NW-mesh when the AMD of the Ag NWs increases to 88.5 mg/m$^2$, 104.5 mg/m$^2$, and 126.2 mg/m$^2$, respectively. That is, the first metal lines and the second metal lines of Ag NW-mesh electrode have AMD in the range of 70 mg/m$^2$ to 130 mg/m$^2$. Under each condition, the Ag NW-mesh may have a line width in the range of 8 μm to 14 μm.

Example 3

Figure 6A:
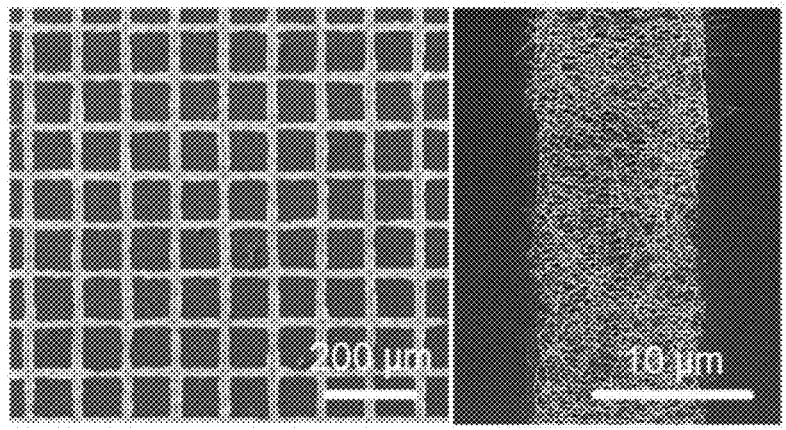
FIG. 6A to FIG. 6I present SEM images of an Ag NW-mesh electrode according to an increase in AMD and an increase in energy density in the progress of SLW in one embodiment of the present invention.
Figure 6B:
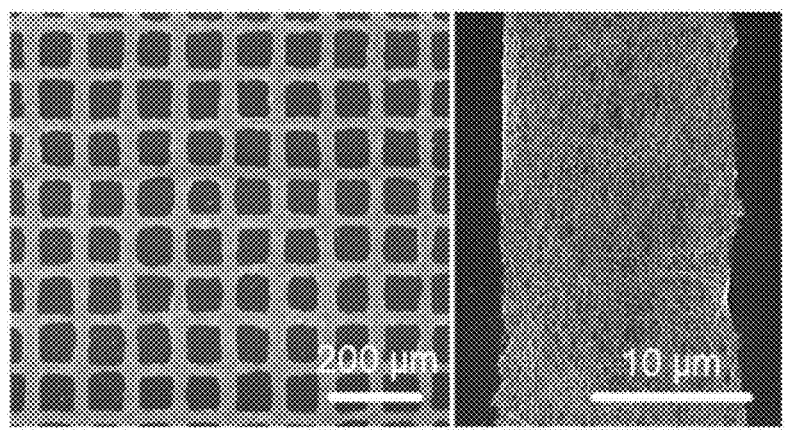
Figure 6C:
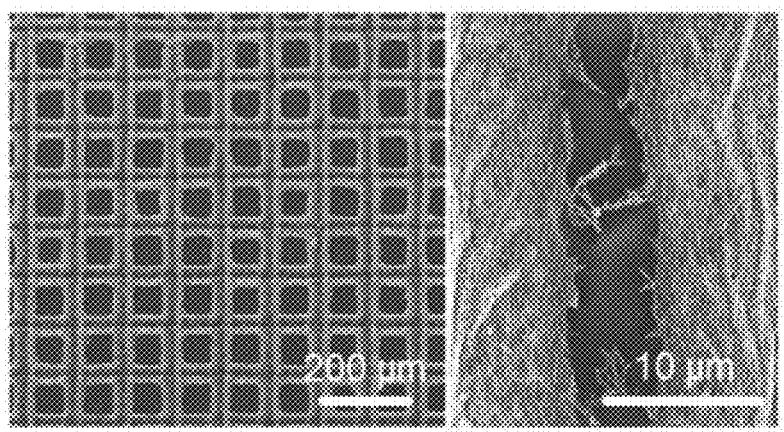
Figure 6D:
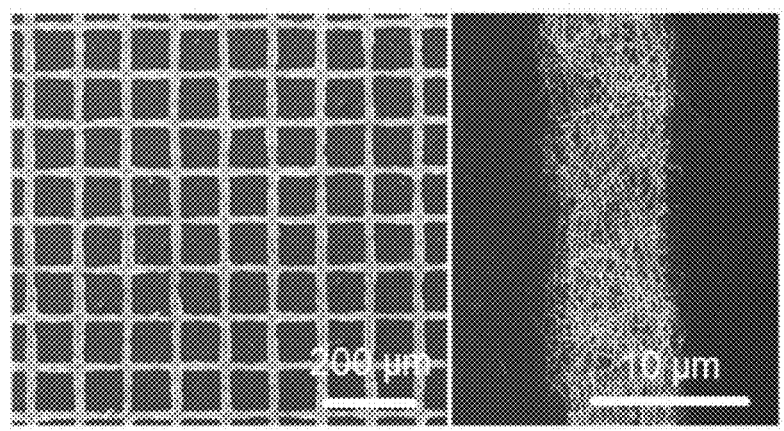
Figure 6E:
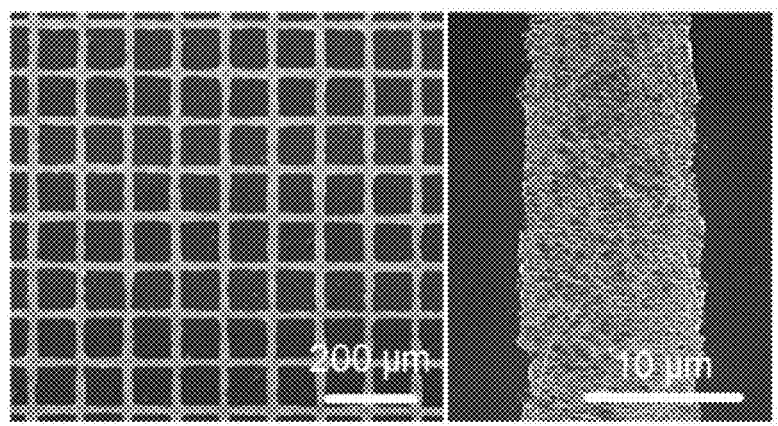
Figure 6F:
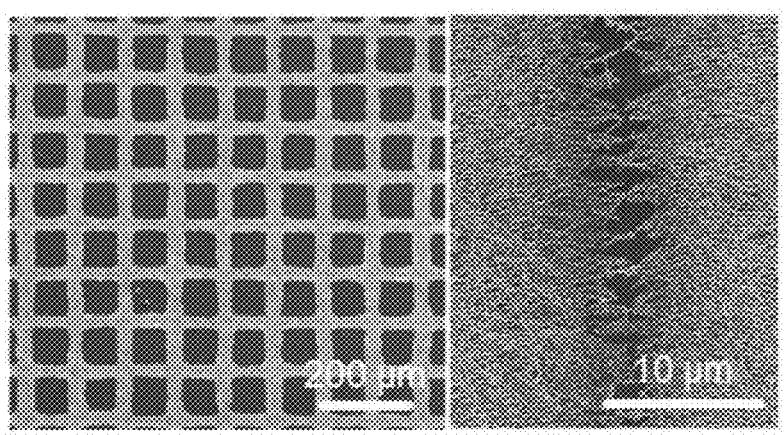
Figure 6G:
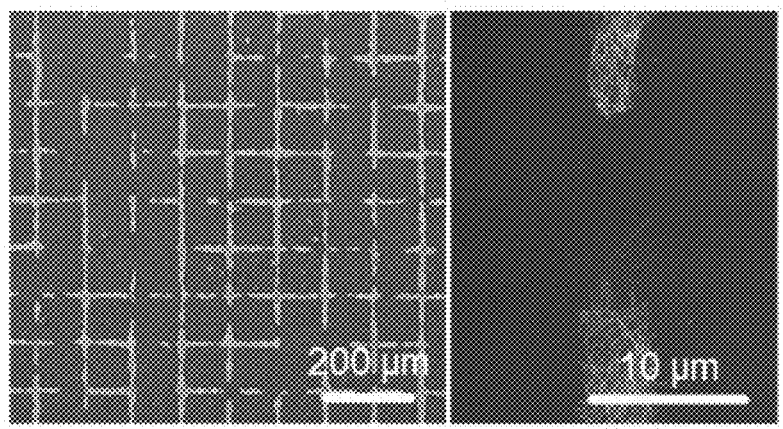
Figure 6H:
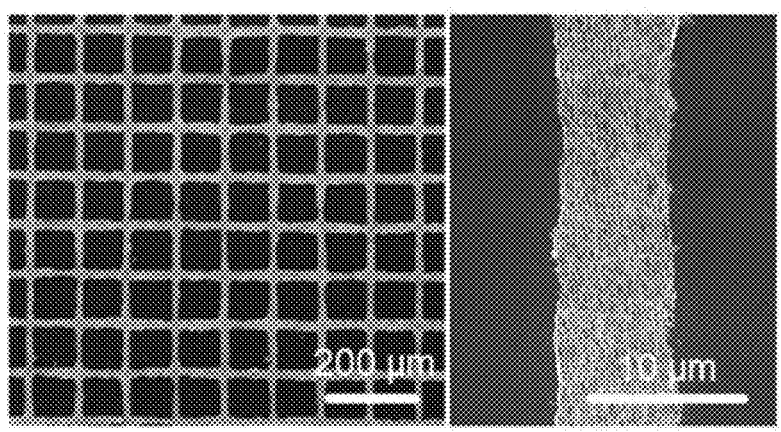
Figure 6I:
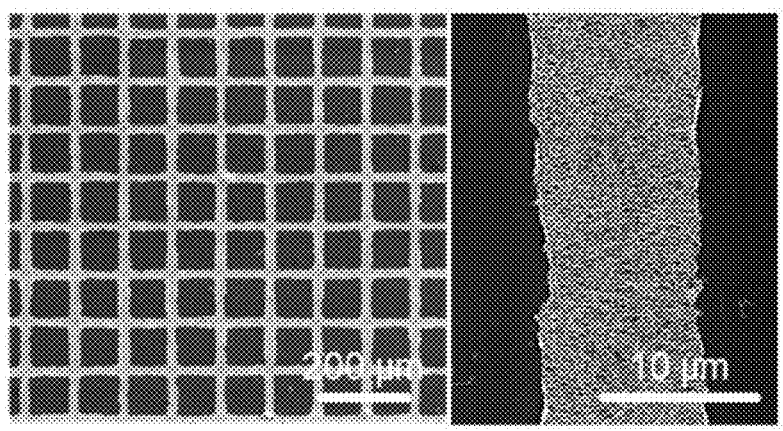

FIG. 6A to FIG. 6I show SEM images when the energy density calculated from laser scan speed and laser power is changed to 3 J/cm$^2$ (FIG. 6A to FIG. 6C), 2 J/cm$^2$ (FIG. 6D to FIG. 6F, and 1 J/cm$^2$ (FIG. 6G to FIG. 6I) and AMD increases to 88.5 mg/m$^2$ (FIG. 6A, FIG. 6D, and FIG. 6G), 104.5 mg/m$^2$ (FIG. 6B, FIG. 6E, and FIG. 6H), and 126.2 mg/m$^2$ (FIG. 6C, FIG. 6F, and FIG. 6I). As shown in FIG. 6C and FIG. 6F, the Ag NW-mesh was over-welded by excessive heat being applied due to high energy density attributed to the high laser power and the low laser scan speed. On the contrary, FIG. 6G shows an imcompletely welded Ag NW-mesh due to the low energy density attributed to the low laser power and the fast laser scan speed.

FIG. 7A to FIG. 7E and FIG. 8A to FIG. 8E show enlarged SEM images and AFM z-axis cross-sectional profile graphs of an Ag NW-mesh fabricated by reducing the laser density by gradually increasing a laser scan speed to 0.3 m/s, 0.5 m/s, 0.7 m/s, 1 m/s, and 1.5 m/s with a fixed laser power of 120 mW and a fixed AMD (104.5 mg/m$^2$).

Figure 7A:
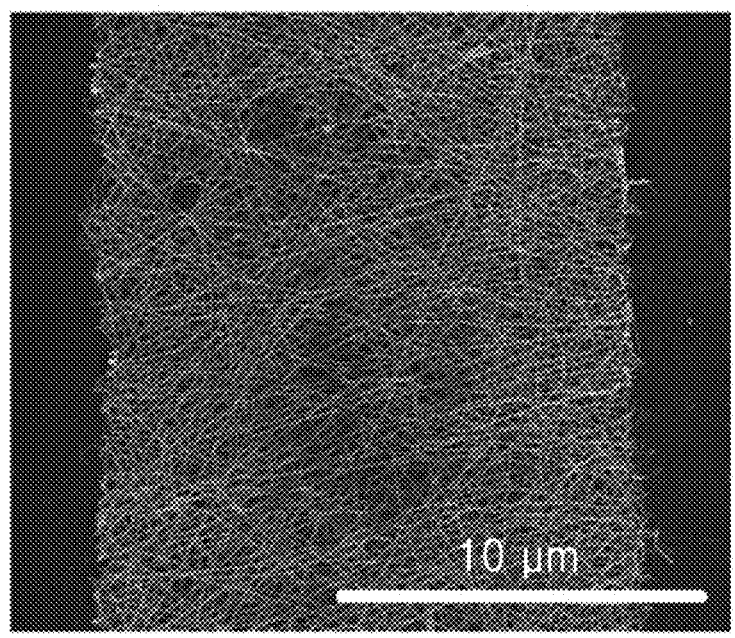
FIG. 7A to FIG. 7E present SEM images of an Ag NW-mesh electrode according to an increase in laser scan speed at a fixed laser power in the progress of SLW in one example of the present invention.
Figure 7B:
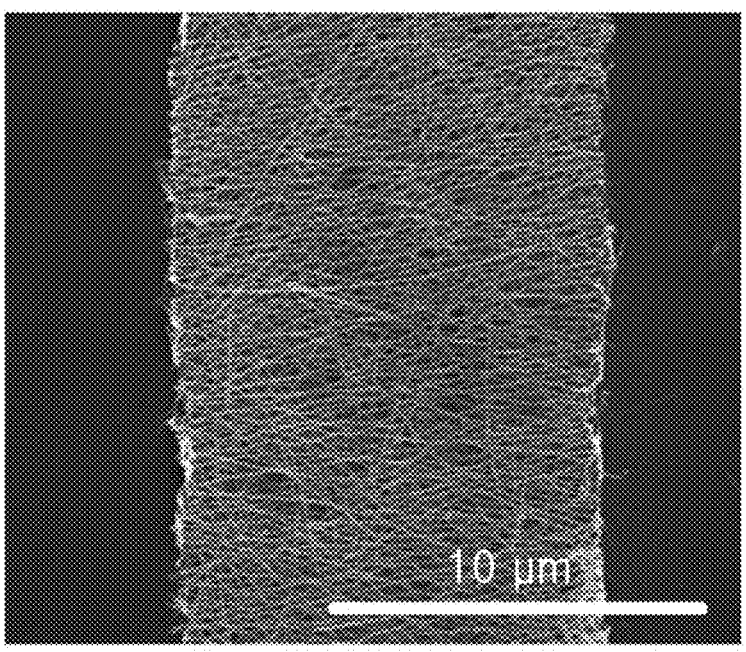
Figure 7C:
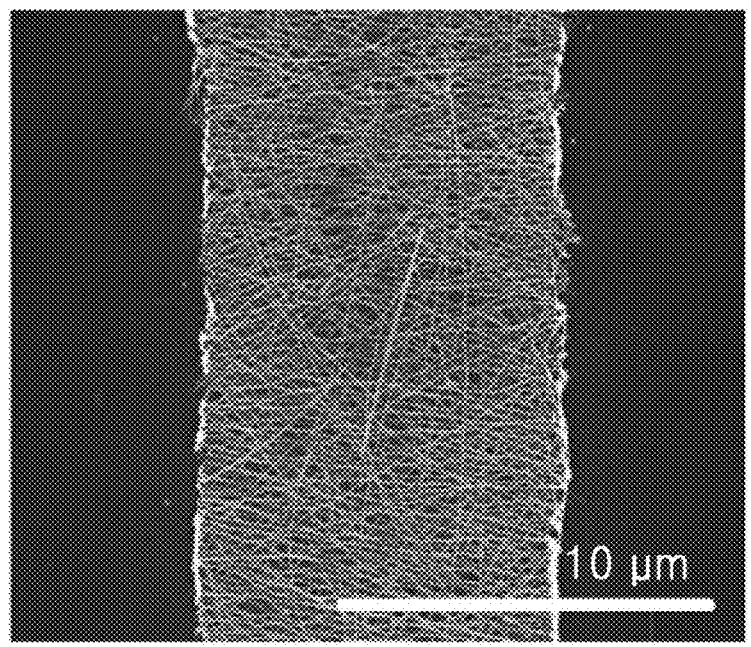
Figure 7D:
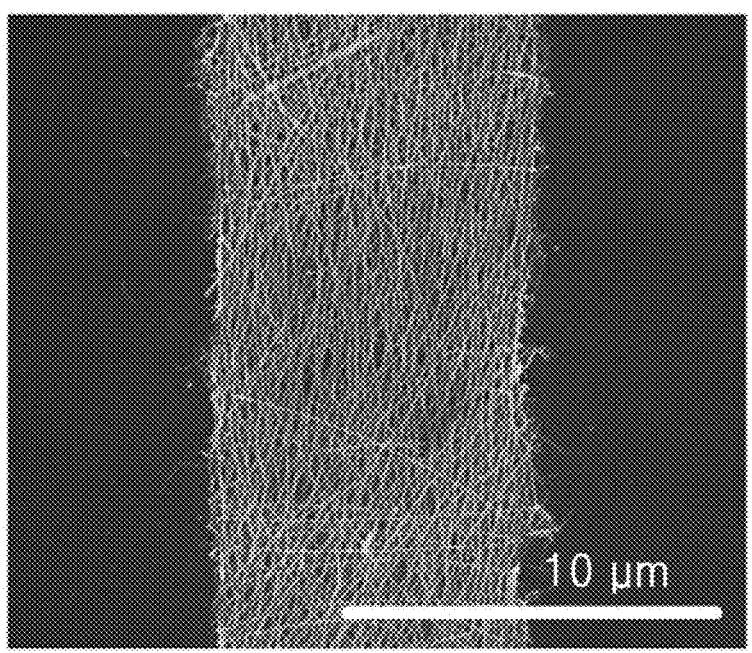
Figure 7E:
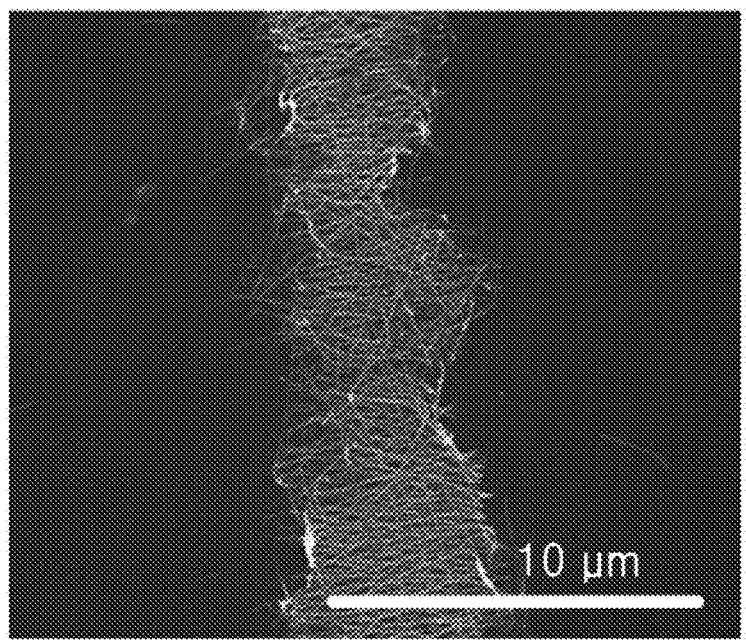
Figure 8A:
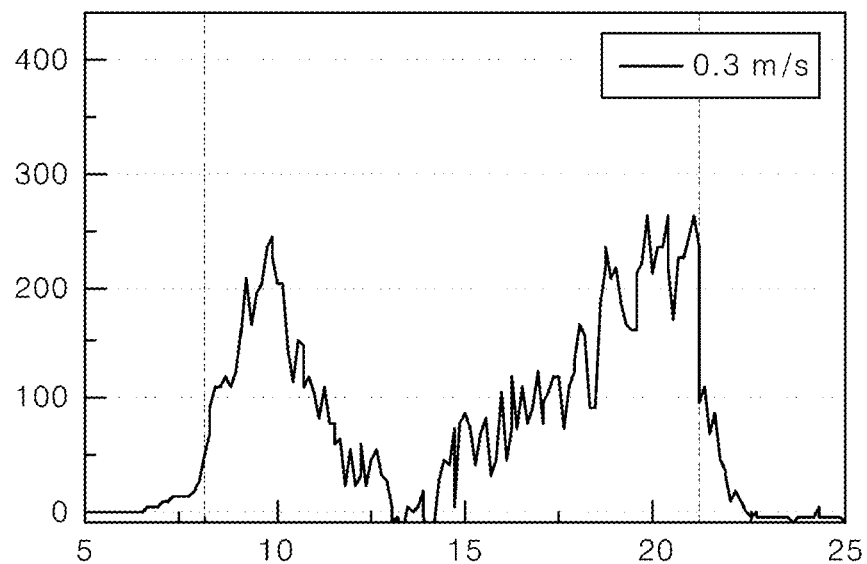
FIG. 8A to FIG. 8E present graphs of an AFM z-axis profile of an Ag NW-mesh electrode according to an increase in laser scan speed at a fixed laser power in SLW in one example of the present invention.
Figure 8B:
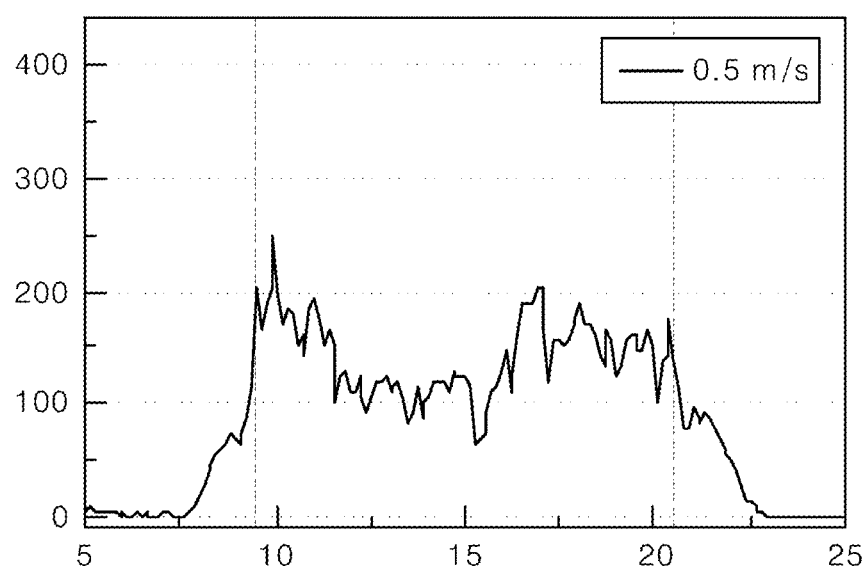
Figure 8C:
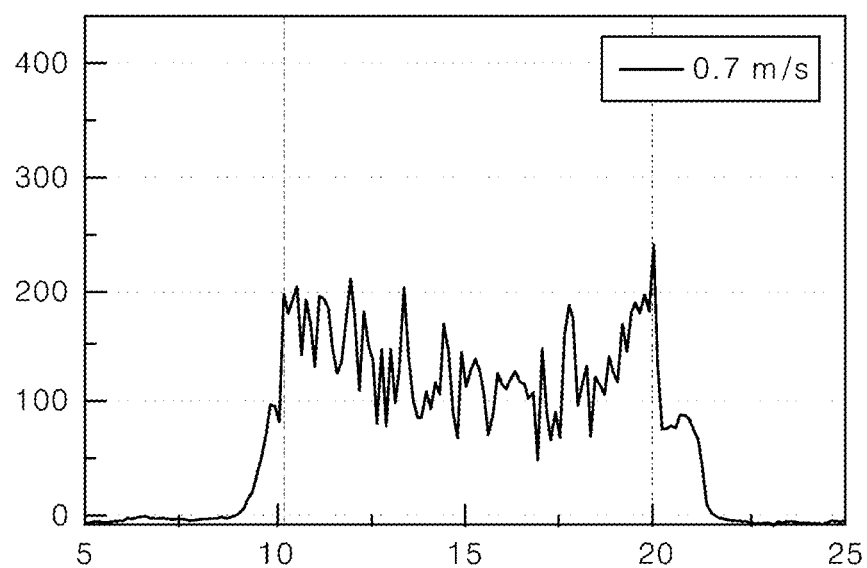
Figure 8D:
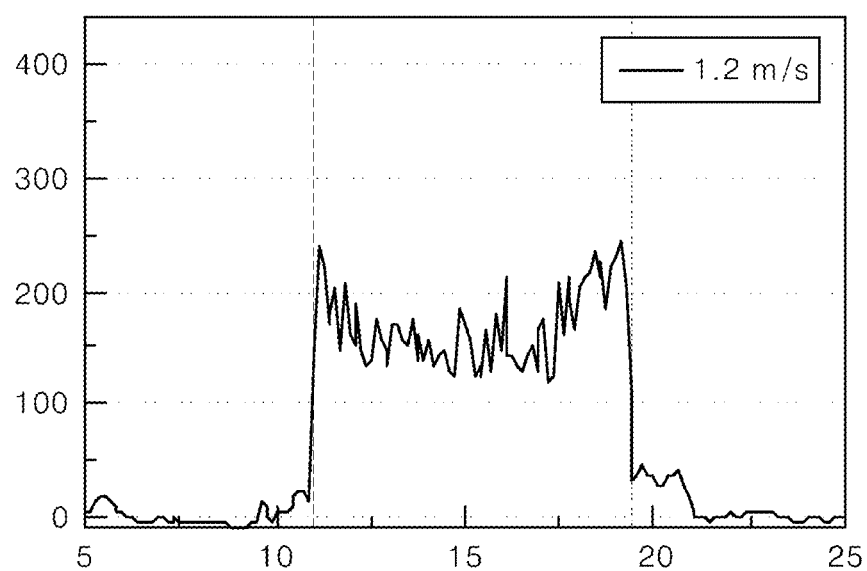
Figure 8E:
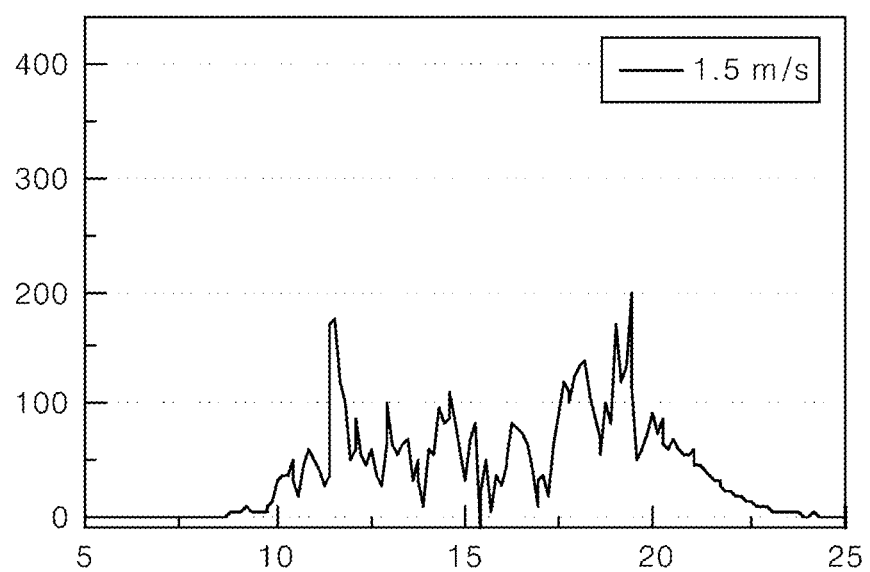
Figure 9:
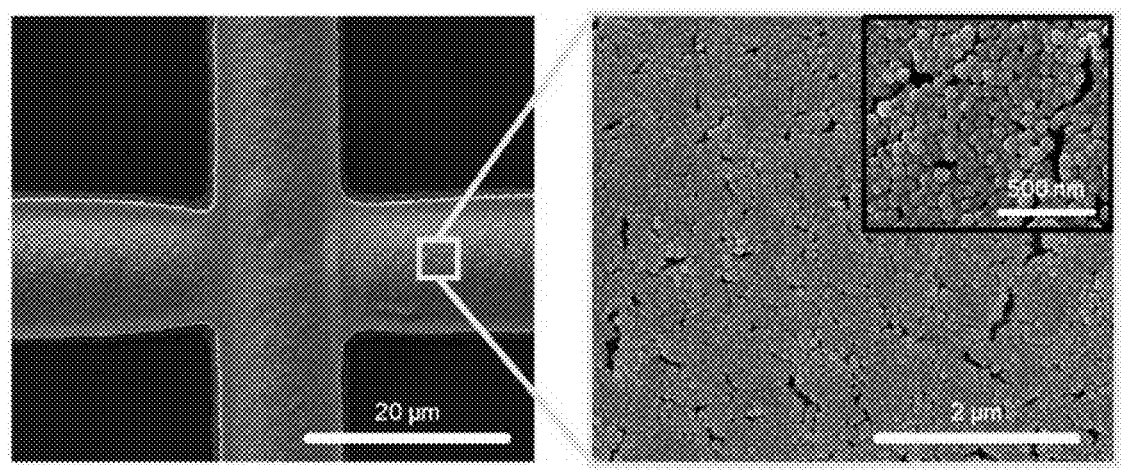
FIG. 9 presents a SEM image of Ag NP-mesh line fabricated via SLW and an enlarged SEM image of the inside thereof in a comparative example of the present invention.

As shown in FIG. 7A and FIG. 8A, if the speed is too slow, relatively high heat is applied to form a mesh, and parts agglomerated by high heat are removed from the center by washing, resulting in a damaged mesh line. When the mesh line is produced by increasing the laser scan speed, the line width of the Ag NW-mesh becomes thinner and the profile thereof is uniformly formed (refer to FIG. 7B to FIG. 7D and FIG. 8B to FIG. 8D). As can be seen in FIG. 8B to FIG. 8D, the average thickness of the Ag NW-mesh lines gradually increases to about 133, 142, and 166 nm, respectively. When the laser scan speed becomes higher than a predetermined threshold value of 1.2 m/s, mesh lines are not generated because the adhesion between the Ag NW-mesh lines and the PET substrate is insufficient or the required laser welding on an Ag NW-mesh surface is insufficient (refer to FIG. 7E and FIG. 8E). That is, the length of the line width is determined within an appropriate range of the laser power and scan speed, and as the scan speed increases within the appropriate range of laser power, the edge profile becomes sharper and the thickness gradually increases. FIG. 9 shows SEM images of the inside of the Ag NP-mesh line produced by SLW, wherein nanoparticles inside the line are welded and connected, but some cracks are found due to local sintering shrinkage.

Example 4

The actual open area fraction (OAF) of a mesh electrode film was calculated as the area fraction coverage that corresponds to the percentage of a substrate surface which is not covered by the material due to the nature of the mesh. Also, the actual OAF was measured through an image analysis program based on the obtained SEM image. The OAF of a mesh-based transparent electrode film may be expressed by the following equations.

$$OFA = \frac{(S-W)^2}{S^2} \times 100 = (1-f_F) \times 100 \; (\%) \quad (1)$$

$$f_F = A_{mesh}/A_{Total} = \frac{(S \times W) + [(S-W) \times W]}{S^2} = \frac{2SW - W^2}{S^2} \quad (2)$$

Here, S and W are the line spacing and line distance of the mesh electrode, respectively. In addition, OAF may be expressed as a filling factor $f_F$, which may be defined as the amount of the mesh electrode area $A_{mesh}$ on a substrate.

Figure 10A:
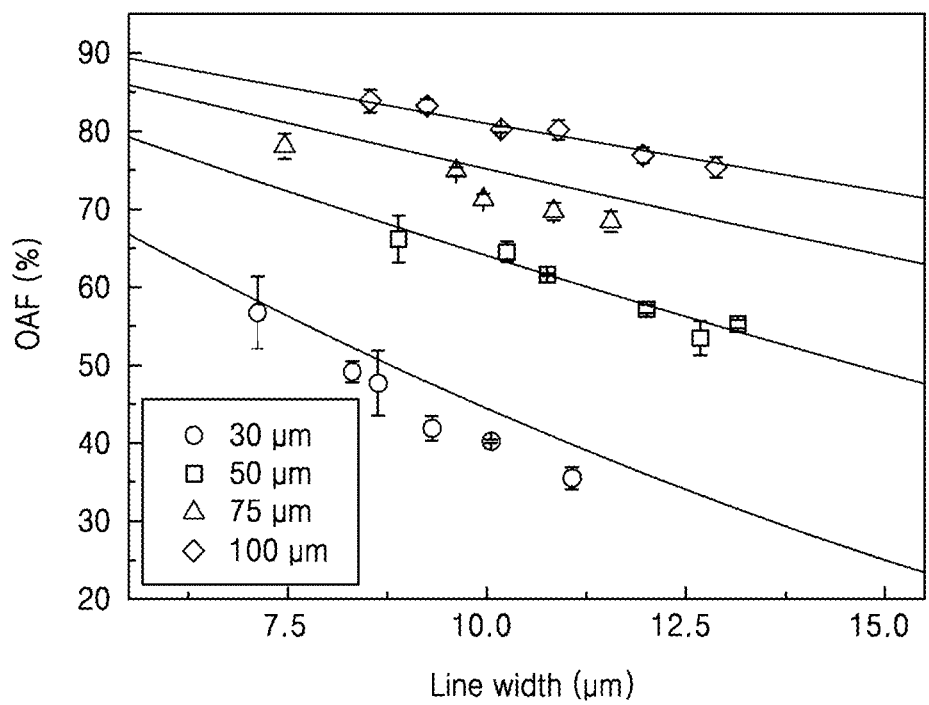
FIG. 10A to FIG. 10D show OFA, relative transmittance (T550), sheet resistance (Rs), and figure of merit (FoMB) of a bulk region of an Ag NW-mesh electrode according to an embodiment of the present invention.

In the case of a mesh-patterned electrode, light transmittance and electrical conductivity properties may be optimized by a geometric structure, such as a mesh line width and a line distance. FIG. 10A shows changes of OAF according to line width W and line spacing S of the Ag NW-mesh electrode. Each point represents the actual OAF measured through the image analysis program, and the solid line represents a theoretical value calculated according to Equation (1) above. By finely adjusting the line spacing and line width, a desired OAF value of 35.5% to 83.9% could be obtained. For example, at a line spacing of 30 μm and a line width of 11.1 μm, the OAF was 35.5%, and at a line spacing of 100 μm and a line width of 11.3 μm, the OAF was 83.9%.

Figure 10B:
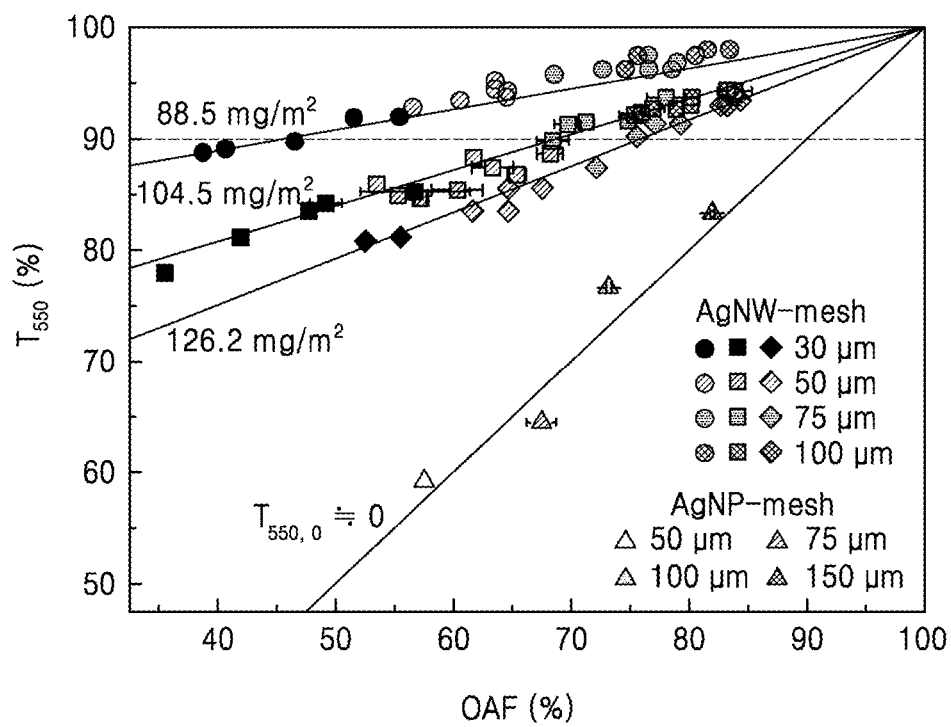

FIG. 10B shows changes of the relative transmittance T550 of each mesh electrode according to the OAF value, and experimental and theoretical values are shown in a graph. Since the mesh line of a typical mesh transparent electrode is composed of Ag powder, the transmittance $T_{mesh,0}$ of the mesh line itself is almost 0, and thus $T_{mesh} \approx 100(1-f_F)$. On the other hand, the Ag NW-mesh is composed of nanowires with random mesh lines, unlike the conventional mesh transparent electrode, so it is expressed by the following Equation (3) corrected by the transmittance of the Ag NW-mesh itself.

$$T_{mesh} \approx 100(1-f_F) + T_{mesh,0} \times f_F \quad (3)$$

In the case of an Ag NP-mesh or Ag film-mesh electrode, which is a typical mesh-based electrode, $T_{mesh,0} \approx 0$, and hence the OFA and relative transmittance have values in one-to-one correspondence, which indicates a relatively large linear slope in the graph. In contrast, in the case of the Ag NW-mesh, it exhibits a different slope depending on the number of Ag NW random networks deposited on the substrate. That is, if, in the graph, AMD of the Ag NW random network increases to 88.5 mg/m², 104.5 mg/m², and 126.2 mg/m², $T_{mesh,0}$ becomes 81.55%, 68.01%, and 85.46%, respectively, and the graph slope decreases relatively gradually.

Figure 10C:
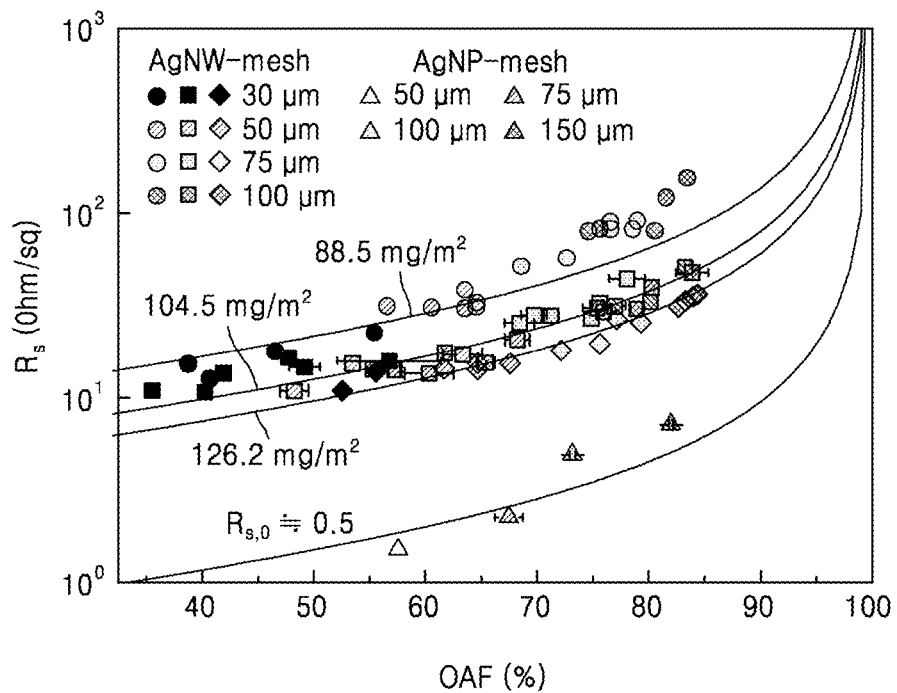

FIG. 10C shows changes of sheet resistance $R_s$ of each mesh electrode according to the OFA value. In similar to the relative transmittance, Rs of the Ag NW-mesh electrode is determined according to the sheet resistance of the Ag NWs forming the random network, has a trend different from that of the general mesh electrode, Ag NP-mesh electrode, and follows Equation (4).

$$R_s = \frac{100+OFA}{100-OFA} \times R_{s,0} = \frac{2-f_F}{f_F} \times R_{s,0} \quad (4)$$

Here, $R_{s,0}$, is the sheet resistance of an electrode film composed of the Ag NWs random network before the mesh electrode is formed. Like the relative transmittance, $R_{s,0}$, of the Ag NP-mesh belonging to the conventional general mesh electrode has a very low value of 0.5 Ω/□ or less. On the other hand, in the case of the Ag NW-mesh, when the AMD of the random network of Ag NWs increases to 88.5 mg/m², 104.5 mg/m², and 126.2 mg/m², $R_{s,0}$ has a value of 7.2 Ω/□, 4.2 Ω/□, 3.2 Ω/□, respectively, and each has a different trend. The $R_s$ and $T_{550}$ values as results obtained from fabricating each Ag NW-mesh transparent electrode are summarized in Table 1 below.

TABLE 1

| Ag NWs | | Pristine Ag NWs* | | Laser welded Ag NWs** | | Ag NW-meshes | | | | | | | |
|---|---|---|---|---|---|---|---|---|---|---|---|---|---|
| | | | | | | S = 30 μm | | S = 50 μm | | S = 75 μm, | | S = 100 μm | |
| concentration (wt %) | AMD (mg/m²) | $R_s$ (Ω/□) | $T_{550}$ (%) | $R_s$ (Ω/□) | $T_{550}$ (%) | $R_s$ (Ω/□) | $T_{550}$ (%) | $R_s$ (Ω/□) | $T_{550}$ (%) | $R_s$ (Ω/□) | $T_{550}$ (%) | $R_s$ (Ω/□) | $T_{550}$ (%) |
| 0.3 | 73.8 | 17.2 | 90.14 | 12.1 | 90.8 | 24.4 | 91.91 | 42.8 | 94.01 | 156 | 98.94 | 516 | 99.14 |
| 0.5 | 88.5 | 8.9 | 81.1 | 7.2 | 81.55 | 17.9 | 89.79 | 31.6 | 92.5 | 82.6 | 96.26 | 122 | 98.02 |
| 0.6 | 92.7 | 6.5 | 75.25 | 5.1 | 74.55 | 15.8 | 85.26 | 24.1 | 91.78 | 44.3 | 93.7 | 80.25 | 96.24 |
| 0.7 | 104.5 | 4.7 | 69.83 | 4.2 | 68.01 | 13.7 | 82.01 | 20.7 | 88.67 | 28.1 | 91.32 | 39.9 | 93.75 |
| 0.8 | 108.9 | 4.0 | 63.51 | 3.7 | 64.47 | 11.4 | 80.83 | 17.6 | 86.89 | 21.7 | 90.83 | 36.35 | 93.48 |
| 1 | 126.2 | 3.3 | 54.34 | 3.2 | 58.46 | 8.2 | 78.66 | 15.6 | 85.55 | 19.6 | 90.22 | 31.05 | 93.02 |
| $FoM_B$ | | 162.3 | | 181 | | | | | | 152 | | | |

Figure 10D:
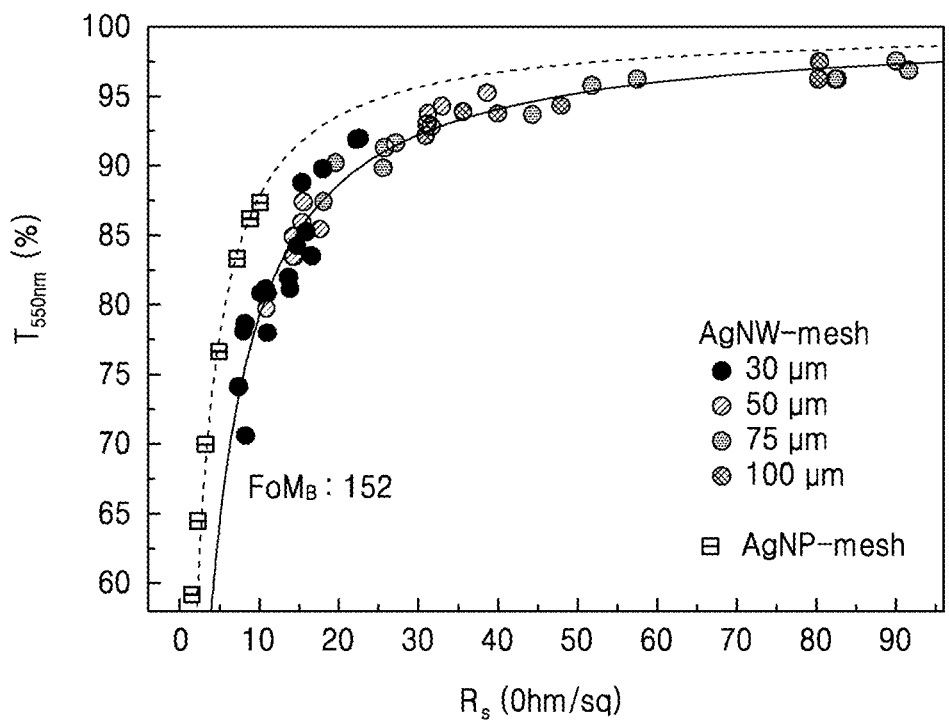

*Ag NWs transparent electrode film coated with existing wet roll on PET
**Laser fusion is performed on the roll-coated Ag NWs transparent electrode film FIG. 10D and Table 2 compare the $R_s$ and $T_{550}$ of the Ag NW-mesh prepared in the above example with the performances of other transparent electrodes reported in the existing literatures.

TABLE 2

| Transparent electrode | $R_s$ (Ω/□) | $T_{550}$ (%) | $FoM_B$ ($\sigma_{dc}/\sigma_{op}$) | Substrate | Fabrication method | Reference |
|---|---|---|---|---|---|---|
| ITO | 47.37 | 82.32 | 38.9 | CPI | Sputtering | 1 |
| PEDOT:PSS | 57 | 87 | 45.9 | PET | Spin-coating | 2 |
| Graphene | 30 | 90 | 116.2 | PET | CVD | 3 |
| SWCNT | 400 | 81 | 4.2 | PSU | LBL | 4 |
| Ag NWs | 17.2 | 90.14 | 162.3 | PET | Selective laser sintering | This work |
| AgNP-mesh | 7.16 | 83.32 | 280 | PET | Selective laser sintering | This work |

TABLE 2-continued

| Transparent electrode | $R_s$ ($\Omega/\square$) | $T_{550}$ (%) | FoM$_B$ ($\sigma_{dc}/\sigma_{op}$) | Substrate | Fabrication method | Reference |
|---|---|---|---|---|---|---|
| Ag NW-mesh | 15.45 | 85.55 | 152 | PET | Selective laser sintering | This work |

1. Choi, K. H., Kim, J., Noh, Y. J., Na, S. I., & Kim, H. K. (2013). Ag nanowire-embedded ITO films as a near-infrared transparent and flexible anode for flexible organic solar cells. Solar energy materials and solar cells, 110, 147-153.
2. Gueye, M. N., Carella, A., Demadrille, R., & Simonato, J. P. (2017). All-polymeric flexible transparent heaters. ACS Applied Materials & Interfaces, 9(32), 27250-27256.
3. Bae, S., Kim, H., Lee, Y., Xu, X., Park, J. S., Zheng, Y., & Kim, Y. J. (2010). Roll-to-roll production of 30-inch graphene films for transparent electrodes. Nature nanotechnology, 5(8), 574.
4. Oytun, F., Dizman, C., Karatepe, N., Alpturk, O., & Basarir, F. (2017). Preparation of transparent conducting electrode on polysulfone film via multilayer transfer of layer-by-layer assembled carbon nanotubes. Thin Solid Films, 625, 168-176.

In order to compare the optical and electrical performance of the Ag NW-mesh electrode, Rs and T550 in a bulk region were shown, and the figure of merit FoM$_B$ in each bulk region was calculated by Equation (5) below.

$$FoM_B = \frac{\sigma_{OP}(\lambda)}{\sigma_{DC,B}} = \frac{188.5}{R_S(T_{550}^{-1/2} - 1)} \quad (5)$$

Here, $\sigma_{OP}(\lambda)$ and $\sigma_{DC}$ denote optical conductivity and direct current (DC) conductivity at a wavelength of $\lambda$, respectively. The higher FoM$_B$ value indicates the better performance when used as a transparent electrode. The Ag NW-mesh electrode in the above example achieved a FoM$_B$ of 152, which was a high value, compared to other transparent electrode materials, such as ITO, PEDOT, graphene, and CNT, exhibiting excellent performance.

Example 5

A bending test was performed by an in-house fabricated bending tester, and was used to measure a resistance change ($\Delta R/R_0$) of transparent electrode films according to the progress of bending of the electrode films at a constant repetition rate. During the cyclic bending test, the radius of curvature (ROC) was fixed to 1 mm, the test was performed at a speed of 60 rpm/minute, and the size of the film was fixed to 60×60 mm.

To measure the resistance change, silver paste was coated onto both ends of the film for external electrode formation and the electrodes were connected to a DC power supply. A constant voltage was applied at a constant ROC to measure the change in current due to the fatigue of the conductive film as the bending cycle elapsed, and the $\Delta R/R_0$ before and after the bending cycle was calculated.

Figure 11A:
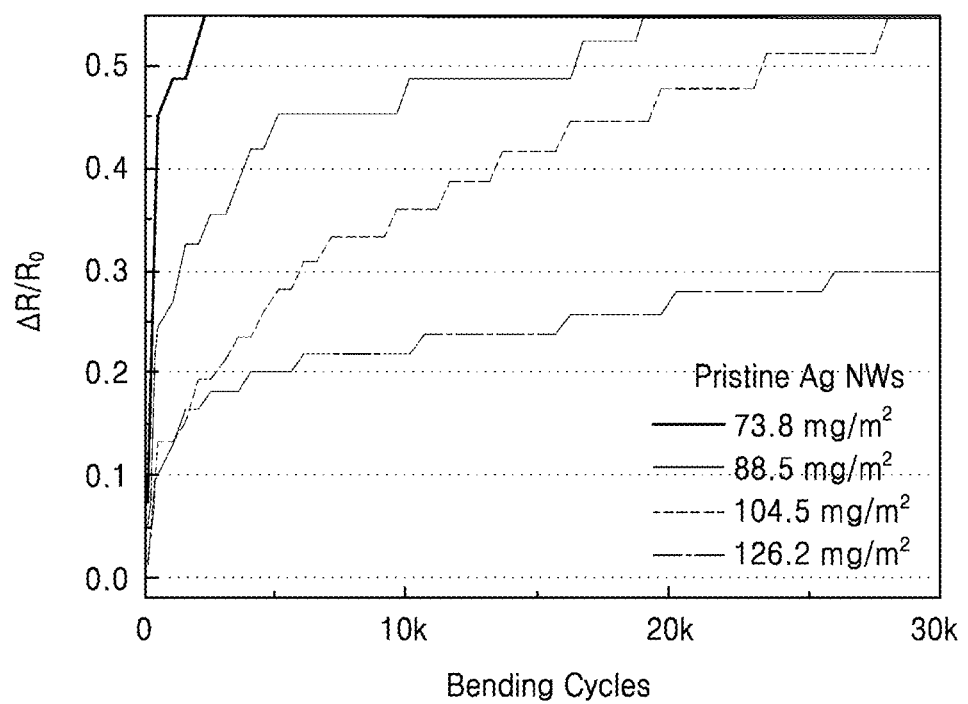
FIG. 11A to FIG. 11B present a graph in FIG. 11A showing resistance change after a cyclic bending test for a prestine Ag NWs electrode with increasing AMD according to an embodiment of the present invention and a graph in FIG. 11B showing the resistance change after a cyclic bending test for an Ag NW-mesh electrode with varied line width according to an embodiment of the present invention.

FIG. 11A shows resistance change $\Delta R/R_0$ after 30,000 cycles of cyclic bending test at an ROC of 1 mm for a prestine Ag NWs having a random network structure, before an Ag NW-mesh was formed. As the AMD of pristine Ag NWs increased, the contact portion where individual nanowires were connected increased, and accordingly, the bending stress applied to the electrode was dispersed into the connected nanowires and thus led to the decrease in $\Delta R/R_0$.

Figure 11B:
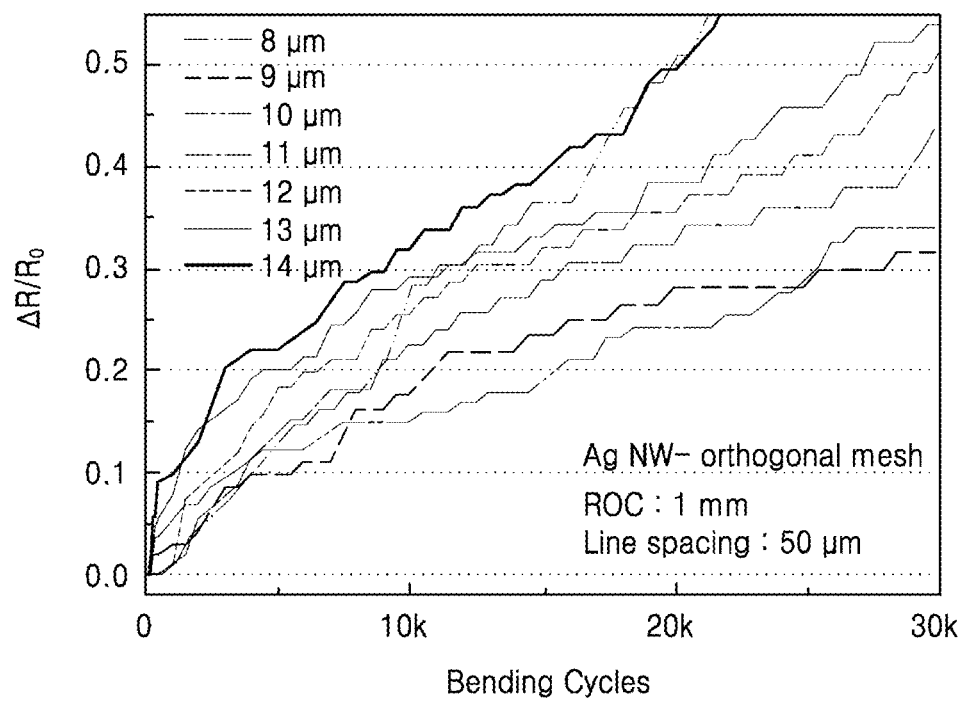

FIG. 11B is a graph showing $\Delta R/R_0$ based on the line width in the range of 8 μm to 14 μm when the cyclic bending test at an ROC of 1 mm was performed on an Ag NW-mesh electrode film fabricated with a line spacing of 50 μm through SLW. With a too small or too large line width, damaged mesh lines were produced, so that the $\Delta R/R_0$ of the cyclic bending test occurred relatively quickly. Thus, when the cyclic bending test is performed, it is most preferable that the Ag NW-mesh is fabricated to have a line width of 9 μm to 10 μm.

Figure 12A:
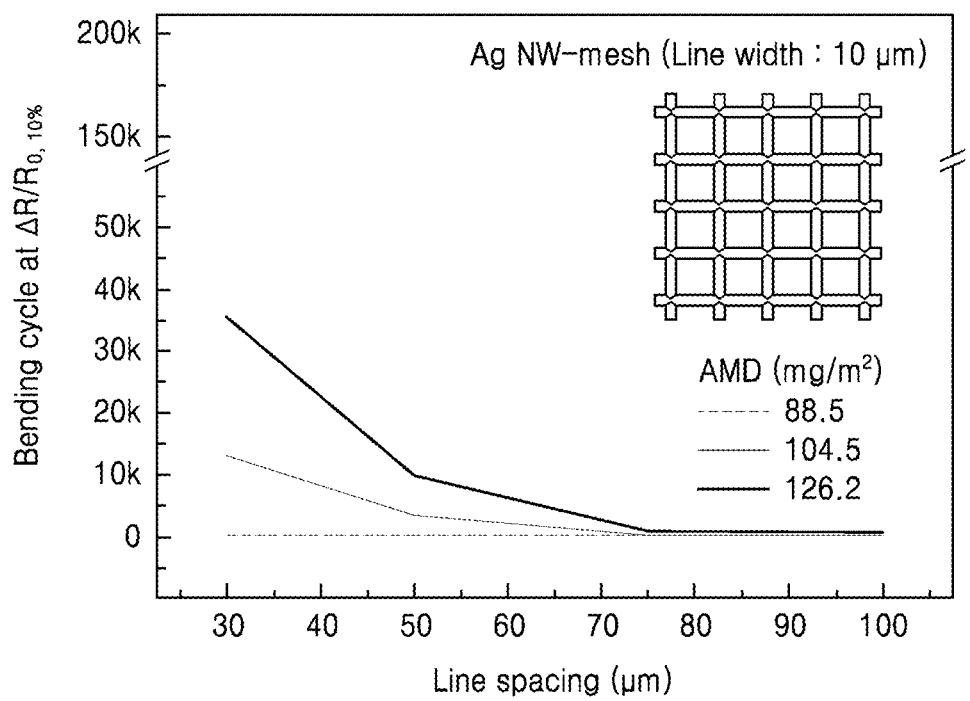
FIG. 12A to FIG. 12B present graphs showing resistance change after a cyclic bending test for an Ag NW-mesh electrode with varied AMD, mesh line spacing, and mesh pattern direction according to an embodiment of the present invention.
Figure 12B:
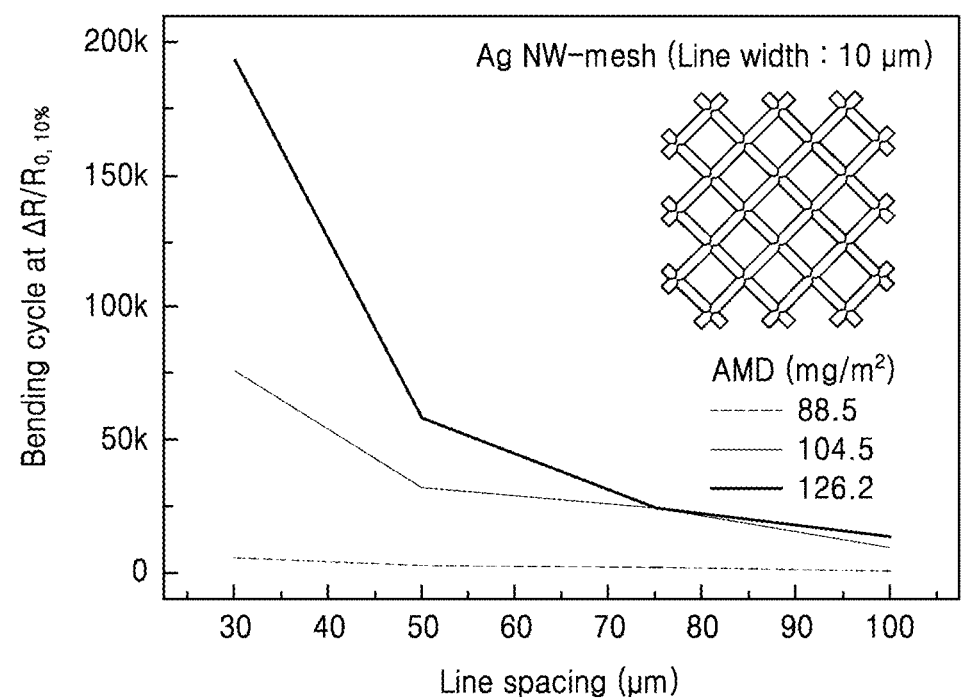

FIG. 12A to 12B present graphs showing the resistance change after a cyclic bending test for varied AMD, mesh line spacing, and mesh pattern direction of the Ag NW-mesh electrodes according to an embodiment of the present invention. Table 3 shows angles formed by mesh lines, a first metal line and a second metal line, with respect to the bending direction, and values of the tensile stress applied to the mesh lines on a PET film.

TABLE 3

| Angle (°) | Max. Ave. Tensile Stress (MPa) |
|---|---|
| 0 | 12907.23 |
| 45 | 13195.89 |
| 90 | 13767.49 |
| 135 | 13195.89 |
| 180 | 12907.23 |
| 225 | 13195.89 |
| 270 | 13767.49 |
| 315 | 13195.89 |
| 360 | 12907.23 |

FIG. 12A is a graph showing the number of bending cycles at the point where the resistance changed by 10% ($\Delta R/R_{0,10\%}$) based on AMD of nanowires inside a line and mesh line spacing when the cyclic bending test at an ROC of 1 mm was performed on an Ag NW-mesh electrode films fabricated through SLW. First, when the cyclic bending test was performed with the line width fixed to 10 μm, it was confirmed that, as the line spacing was reduced to 100 μm, 75 μm, 50 μm, and 30 μm and accordingly a denser mesh was formed, or as the AMD of the Ag NWs inside the line increased, the number of bending cycles at which the $\Delta R/R_{0,10\%}$ occurred increased. For example, when the line spacing was reduced to 100 μm, 75 μm, 50 μm, and 30 μm at an AMD of 126.2 mg/m$^2$, the number of cycles at which the $\Delta R/R_{0,10\%}$ occurred was increased to 800, 1000, 10,000, and 35,500, respectively. In addition, when the AMD of Ag NW inside the respective mesh lines increased to 88.5 mg/m$^2$, 104.5 mg/m$^2$, and 126.2 mg/m$^2$, the number of cycles at which the $\Delta R/R_{0,10\%}$ occurred increased to 300, 13,000, and 35,500, respectively. Finally, in FIG. 12B, it was confirmed that, when a line pattern of the Ag NW-mesh was changed from the orthogonal direction to the diagonal direction and the cyclic bending test was performed, the number of bending cycles at which the $\Delta R/R_{0,10\%}$ occurred increased significantly to 5,500, 76,000, and 193,000 at a line spacing of 30 μm. This means that when the pattern is changed to a diagonal pattern by adjusting the angle in the direction in which the stress is concentrated under the constant repeated bending condition to the angle of any one of 35 degrees to 55 degrees, 125 degrees to 145 degrees, 215 degrees to 235 degrees and 305 degrees to 325 degrees, bending durability is greatly improved. More preferably, the angle formed by mesh lines with respect to the bending direction in which the stress is concentrated under a constant repeated bending condition may be adjusted to the angle of any one of 45 degrees, 135 degrees, 225 degrees and 315 degrees. Referring to Table 3, it can be seen that the tensile stress value applied to the mesh lines is minimized when the mesh pattern direction is rotated by 45 degrees to achieve a diagonal mesh.

In other words, it can be seen that as the AMD increases, the distance between lines decreases and the line spacing becomes denser, the bending durability under repeated bending stress is significantly increased when the mesh pattern direction is rotated by the angle of any one of 45 degrees, 135 degrees, 225 degrees and 315 degrees to achieve a diagonal mesh.

Figure 13A:
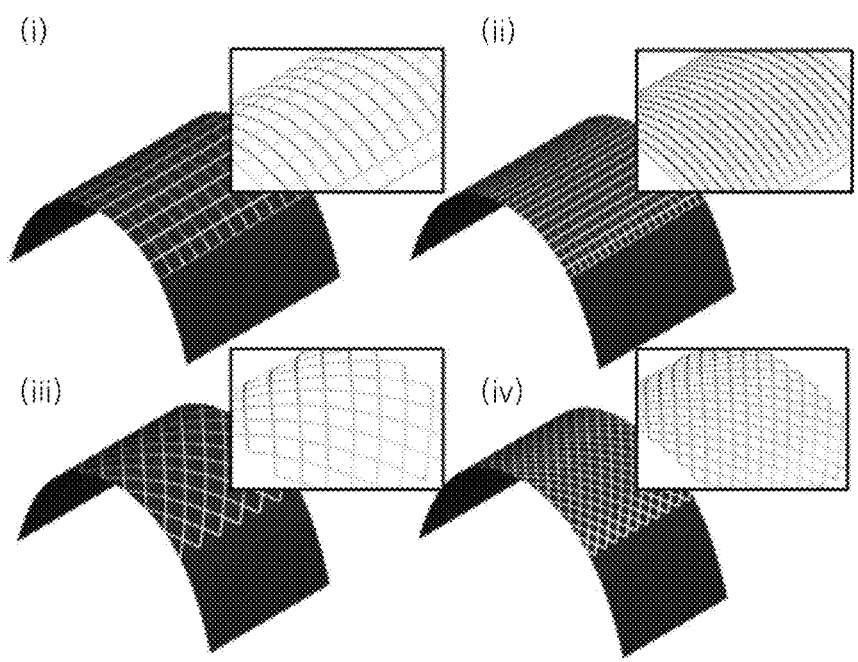
FIG. 13A to FIG. 13B show the distribution of tensile stress in FIG. 13A based on the line spacing and mesh pattern direction of an Ag NW-mesh electrode according to an embodiment of the present invention and the result in FIG. 13B of simulating a ratio of the maximum stress applied to a mesh electrode to the maximum stress applied to PET.
Figure 13B:
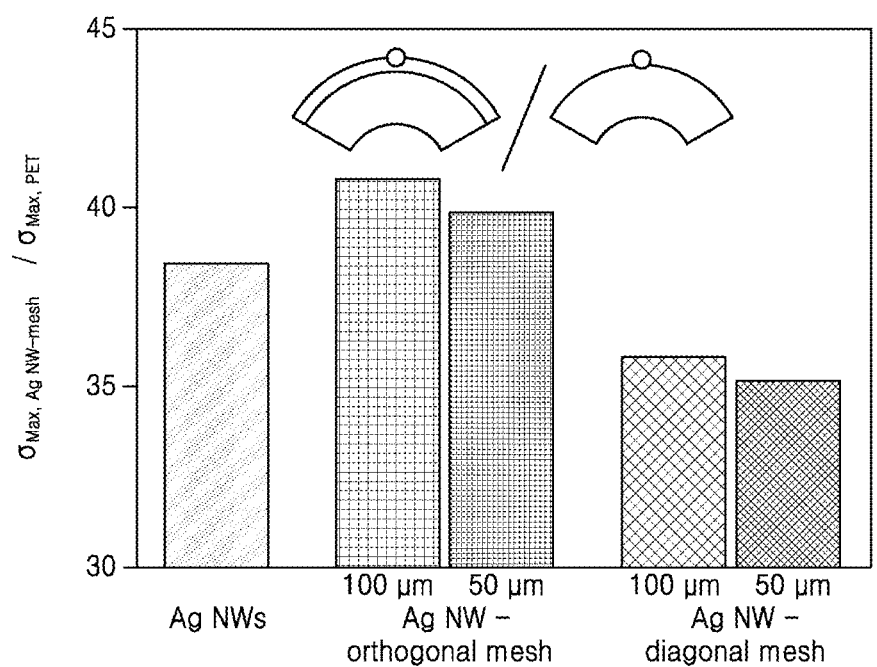

FIG. 13A shows stress distribution results obtained from simulation of a tensile stress based on the line spacing and the mesh direction for the repeated bending stress applied to the Ag NW-mesh electrodes. A Solidworks Simulation program was used for the simulation. Ag NW-orthogonal mesh electrodes with line spacing of 1100 µm and (ii)50 µm, respectively, and Ag NW-diagonal mesh electrodes with line spacing of (iii)100 µm and (iv)50 µm, respectively, were placed on PET and then bent at an ROC of 1 mm, and the corresponding stress distribution was confirmed. In FIG. 13B, the maximum stress applied to each electrode based on the line spacing and direction is shown as a ratio of the maximum stress applied to a PET substrate. As for the stress ratio based on the line spacing, when the mesh line spacing was reduced from 100 µm to 50 µm in the orthogonal mesh and diagonal mesh, the stress ratio decreased by 2.3% and 1.8%, respectively. As for the stress ratio based on the direction, when the direction was changed from the orthogonal mesh to the diagonal mesh at mesh line spacing of 100 µm and 50 µm, the stress ratio was reduced to 12.2% and 11.7%, respectively, and thus resistance of the diagonal-mesh electrodes to cyclic bending was significantly increased.

Figure 14:
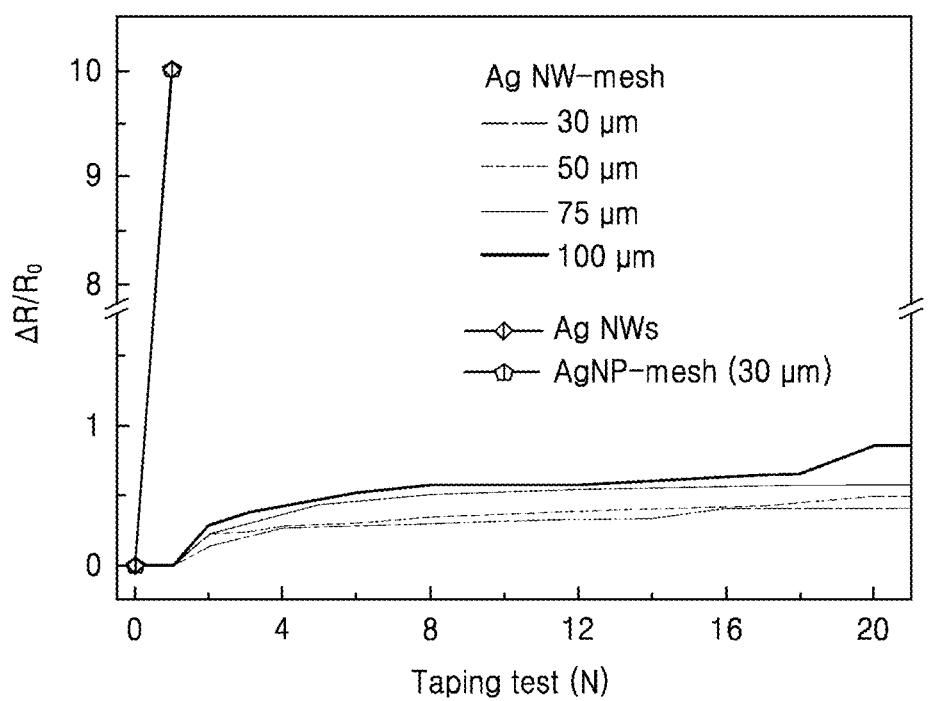
FIG. 14 is a graph showing the results of adhesion test between each of Pristine Ag NWs, Ag NP-mesh, and Ag NW-mesh and a PET substrate according to Examples and Comparative Examples of the present invention.
Figure 15A:
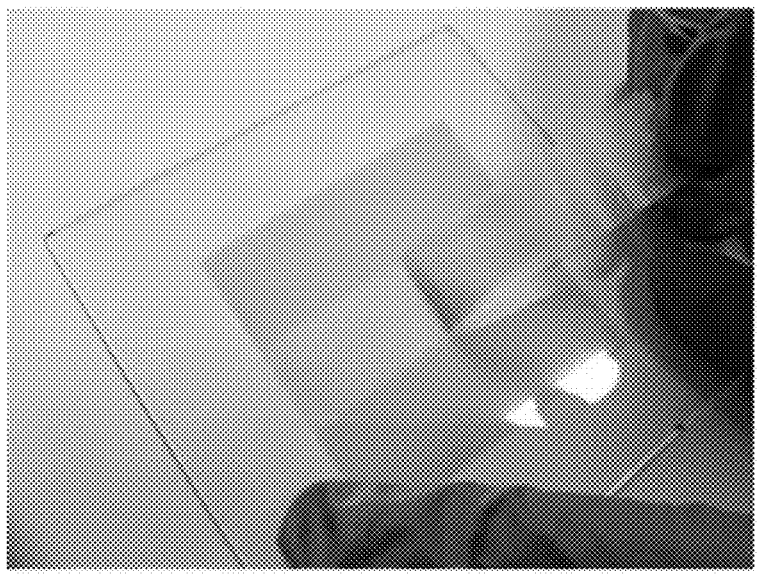
FIG. 15A to FIG. 15I show optical microscope and SEM measurement results.
Figure 15B:
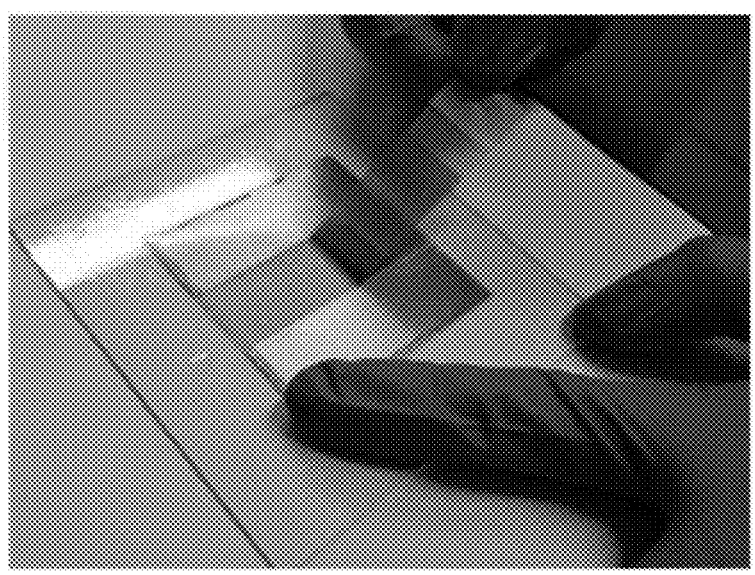
Figure 15C:
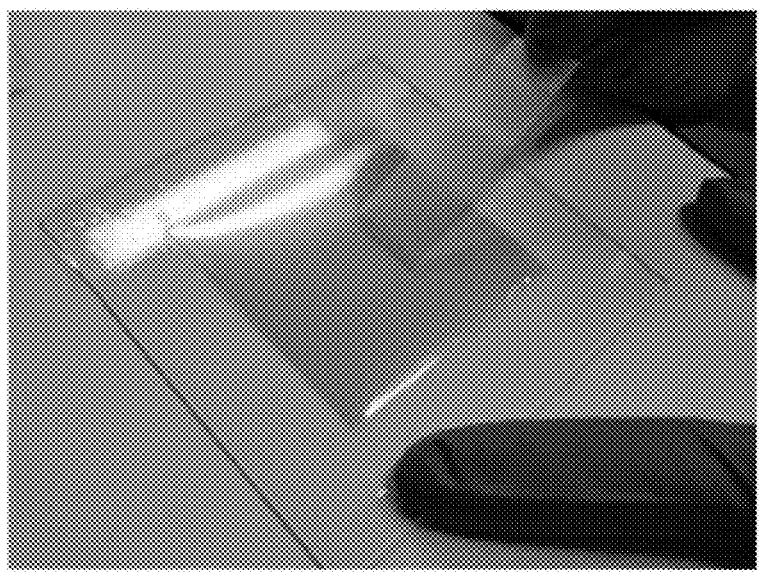
Figure 15D:
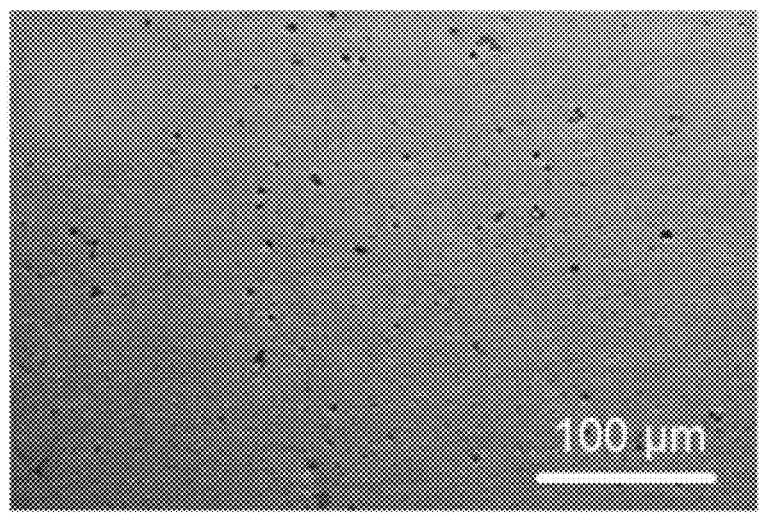
Figure 15E:
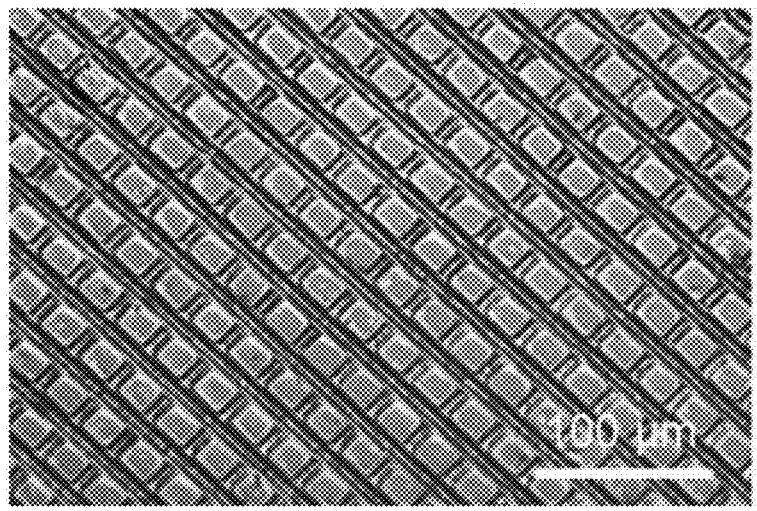
Figure 15F:
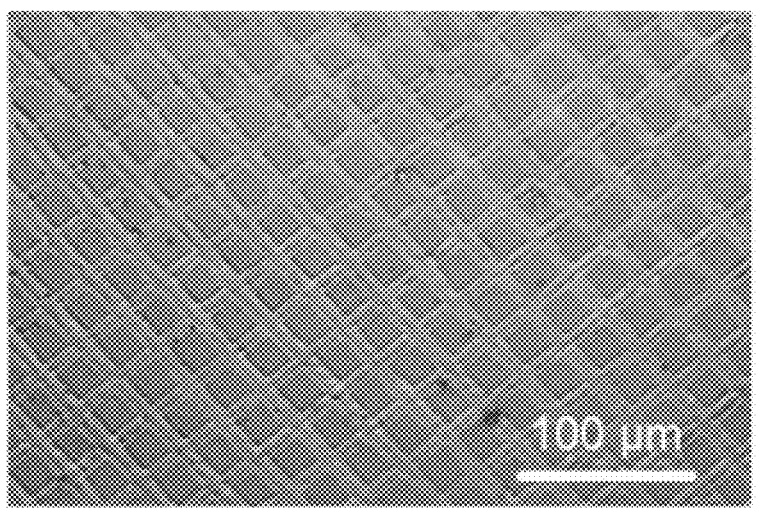
Figure 15G:
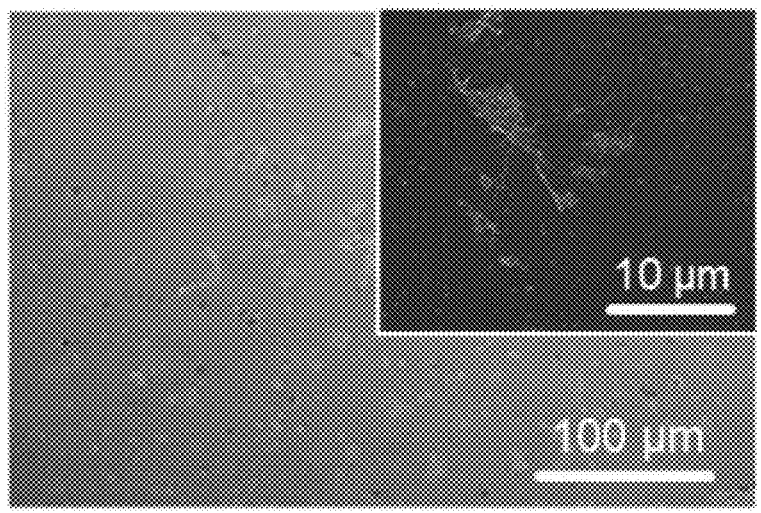
Figure 15H:
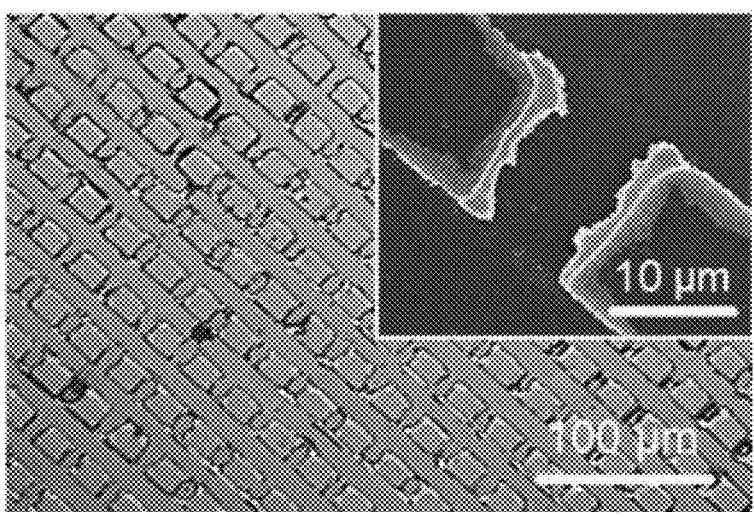
Figure 15I:
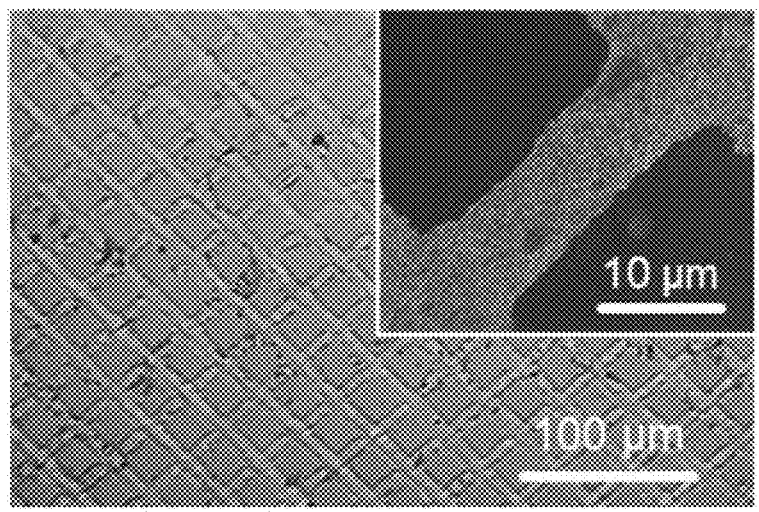
Figure 16A:
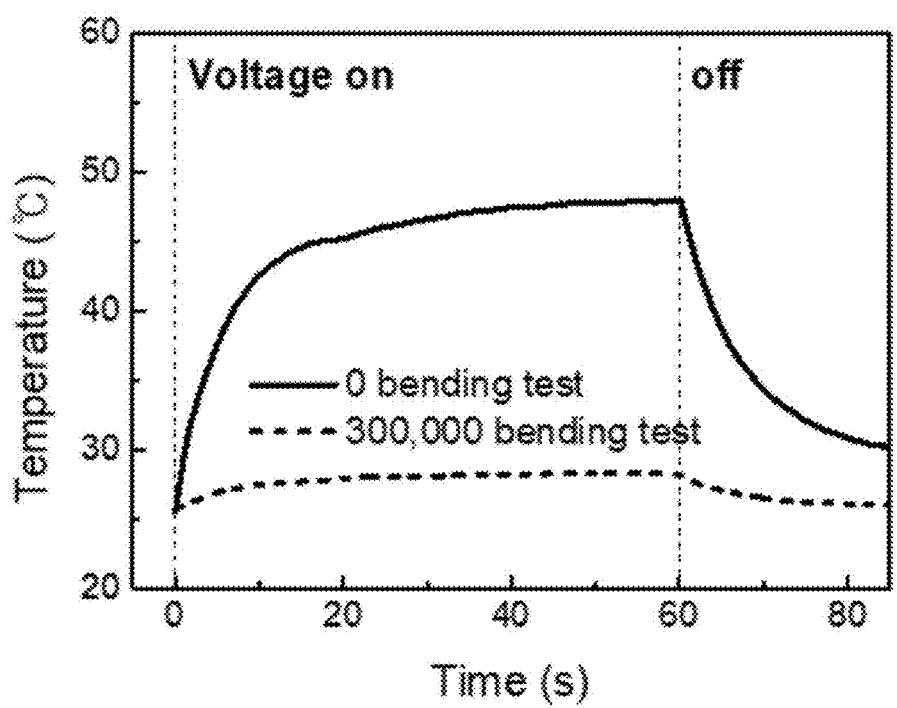
FIG. 16A to FIG. 16D present graphs of temperature change of Pristine Ag NWs, Ag NP-mesh, and Ag NW-mesh electrodes under a constant voltage before and after a cyclic bending test according to Examples and Comparative Examples of the present invention.
Figure 16B:
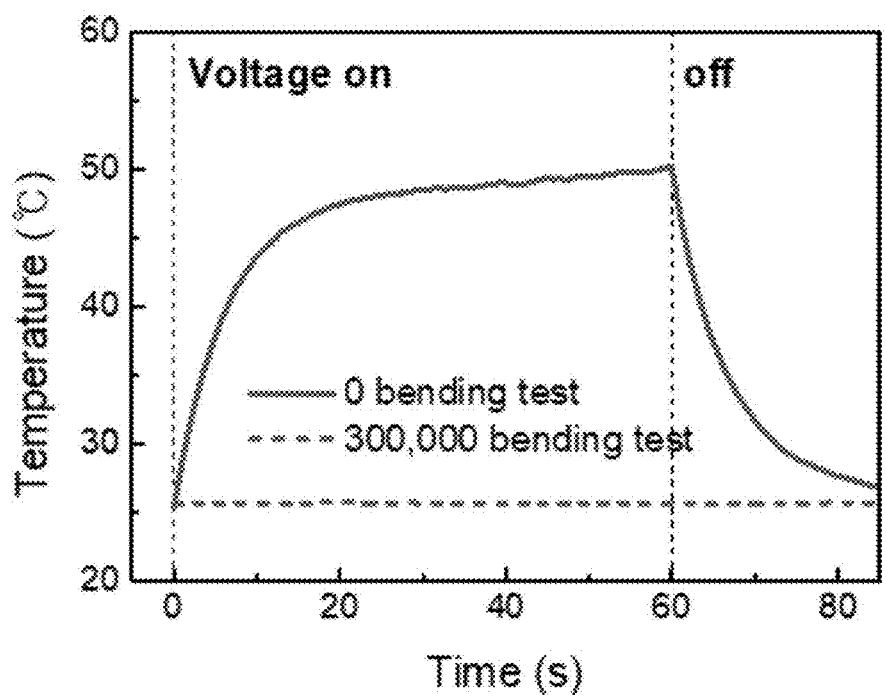
Figure 16C:
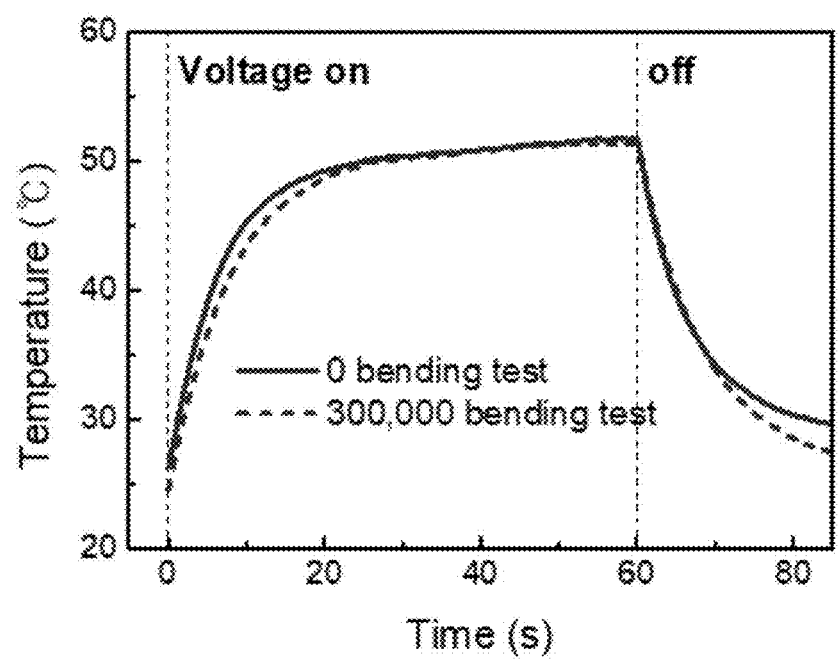
Figure 16D:
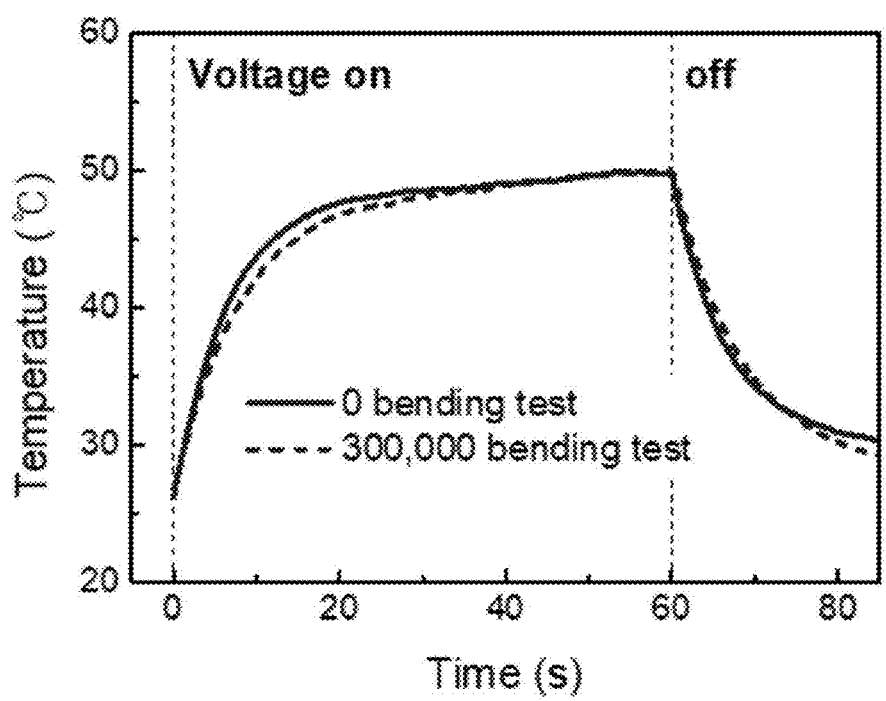
Figure 17A:
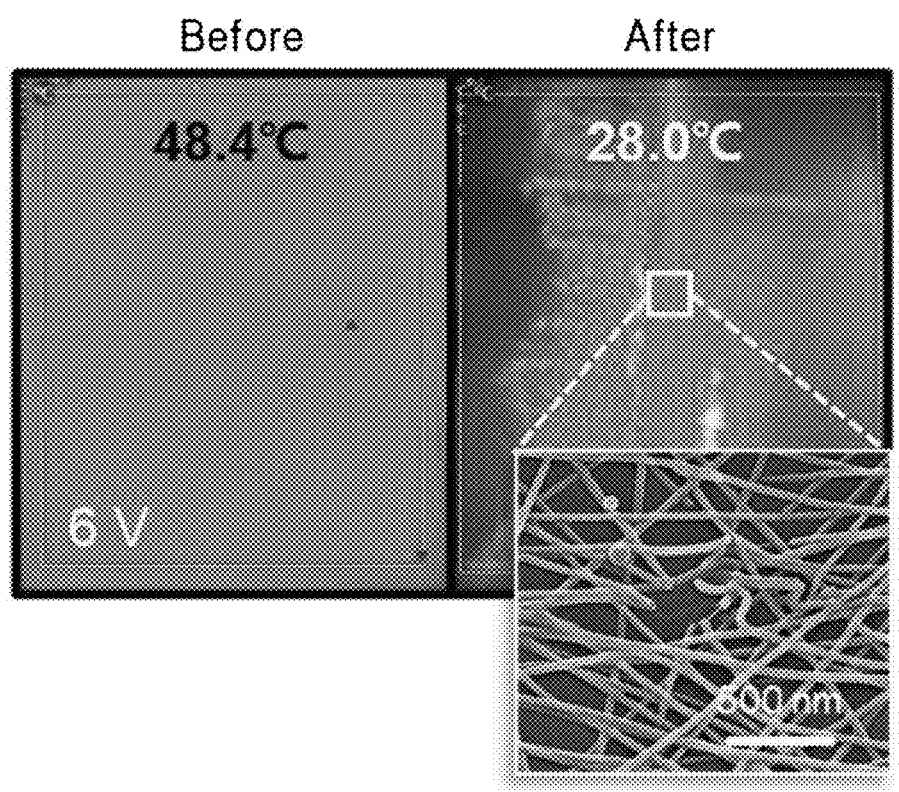
FIG. 17A to FIG. 17D present the thermal measurement images.
Figure 17B:
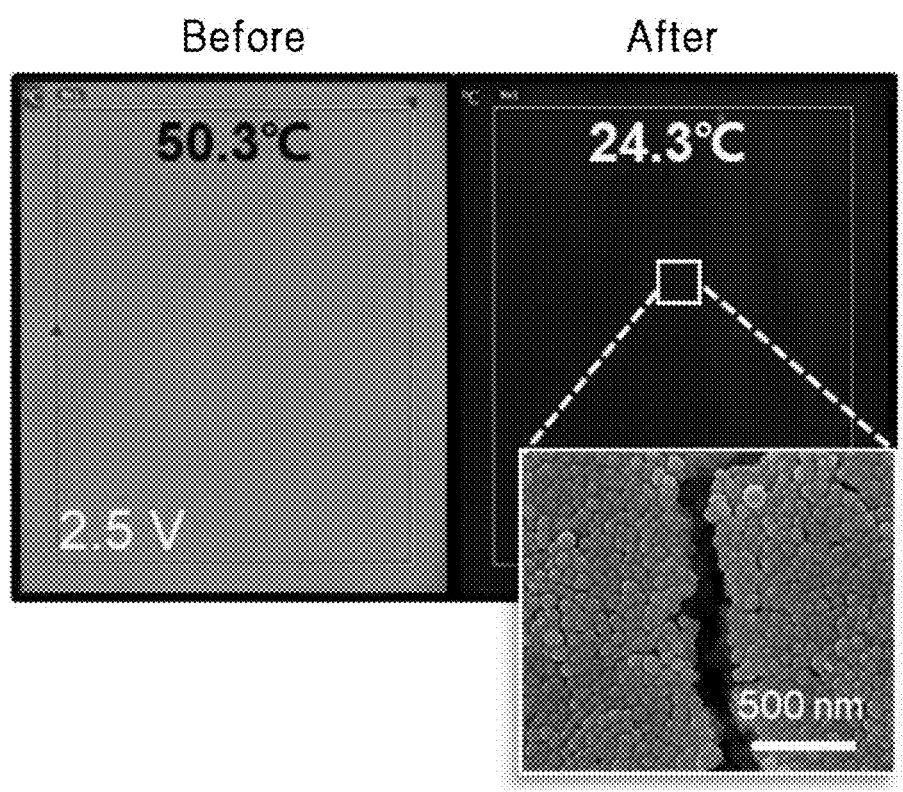
Figure 17C:
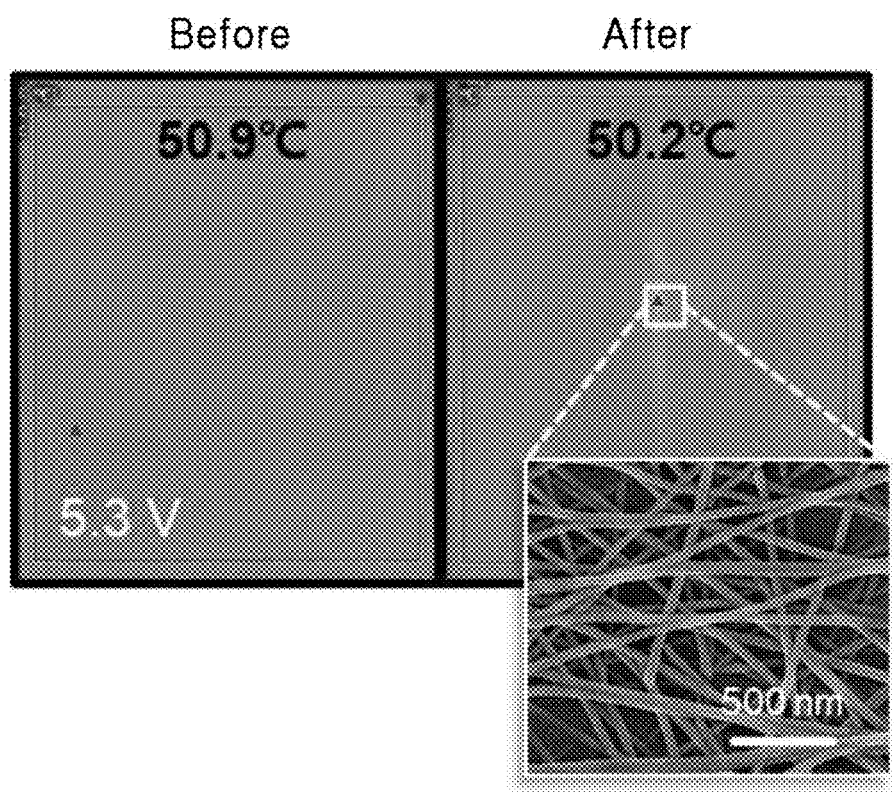
Figure 17D:
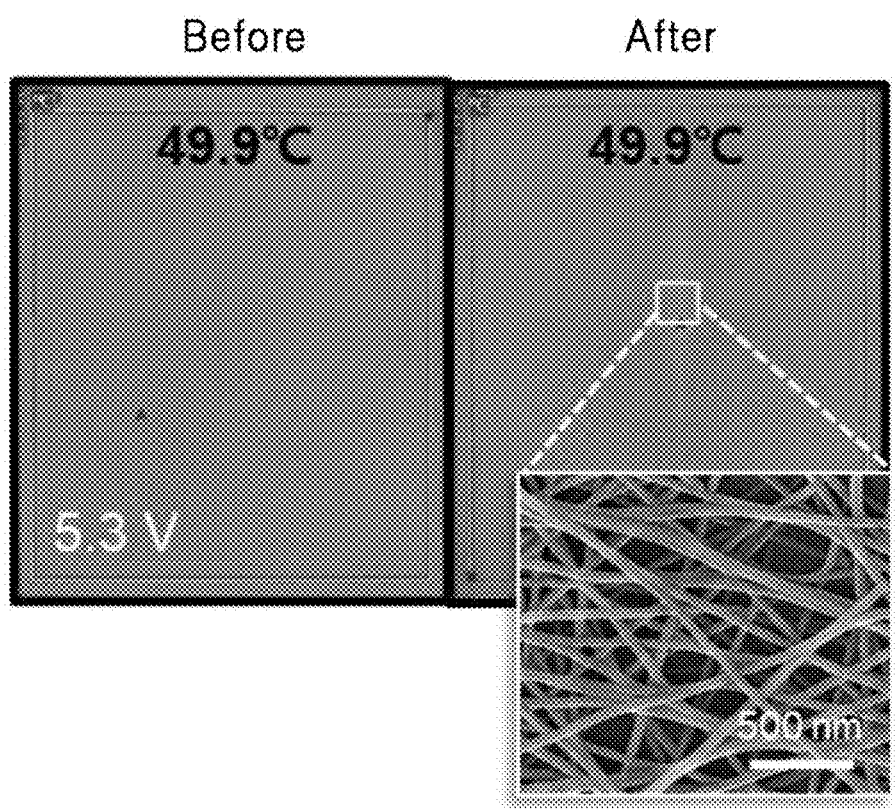

FIGS. 14 and 15 compare the $\Delta R/R_0$ between prestine Ag NWs, Ag NP-mesh, and Ag NW-mesh electrodes after taping test to confirm the improved adhesion between the Ag NW-mesh fabricated through SLW and a PET substrate. FIG. 14 is a graph showing results of taping test of the pristine Ag NWs, Ag NP-mesh, and Ag NW-mesh of a random network. In the case of the pristine Ag NW and the Ag NP-mesh, even after a single taping test, the adhesion to the substrate was significantly decreased, so that they were easily separated from the substrate. This can be confirmed from optical microscope images in FIG. 15A, FIG. 15D and FIG. 15G and SEM images in FIG. 15B, FIG. 15E, and FIG. 15H. On the other hand, FIG. 15C, FIG. 15F, and FIG. 15I show that the Ag NW-mesh fabricated through SLW exhibits a relatively small change in resistance even after the taping test. In particular, Ag NW-mesh with a line spacing of 30 µm showed the resistance change of less than 40% even after 20 cycles of test. Referring to the optical microscope images and the SEM images of FIG. 15G, FIG. 15H, and FIG. 15I, it can be confirmed that the Ag NW-mesh electrodes had small $\Delta R/R_0$ because Ag NWs did not fall off and was adhered to the substrate, whereas the pristine Ag NWs and Ag NP-mesh electrode had increased $\Delta R/R_0$ due to Ag NPs or Ag NWs falling off from the substrate; The smaller $\Delta R/R_0$ of Ag NW-mesh compared to the pristine Ag NW indicates that the adhesion between Ag NWs and the PET substrate increased by laser welding. On the other hand, unlike the Ag NW-mesh, the Ag NP-mesh, despite SLW being performed, exhibited a weak adhesion to the substrate, which might be attributed to the difference in laser absorption capacity between Ag NP and Ag NW.

FIGS. 16 and 17 present graphs of temperature changes and thermal measurement images of transparent heater including each of the pristine Ag NW, Ag NP-mesh, Ag NW-orthogonal mesh, and Ag NW-diagonal mesh electrodes before and after 300,000 cycles of cyclic bending test at an ROC of 1 mm. To evaluate the performance of each transparent electrode film, a voltage of 2.5 V to 6 V was applied equally before and after the cyclic bending test. FIG. 16A and FIG. 17A show a thermal measurement image of the Ag NWs electrode film having uniform heat distribution (48.4° C.) over the entire area of a sample when a voltage of 6 V was applied. However, after 300,000 cycles of cyclic bending test, the average temperature of the Ag NW electrode was reduced to 28° C., and the damaged electrode could be confirmed from the inserted SEM image. In particular, local heat generated due to the damage was concentrated in the area on which the bending test was performed. The increase in resistance resulted from the fact that electrical paths were disconnected as the nanowires were unable to withstand the bending stress at an ROC of 1 mm due to their insufficient bending durability. FIG. 16B and FIG. 17B show thermal measurement images before and after a cyclic bending test on the Ag NP-mesh electrode to which a voltage of 2.5 V was applied. Before the cyclic bending test, the average temperature of the Ag NP-mesh electrode film was 50.3° C., but after the test, it was confirmed that all the electrical paths were blocked and the temperature fell to room temperature. It was confirmed from the inserted SEM image that a complete crack occurred inside the mesh line. FIG. 16C and FIG. 17C show the thermal measurement images of the Ag NW-orthogonal mesh electrode to which a voltage of 5.3 V was applied before and after 300,000 cycles of cyclic bending test at an ROC of 1 mm. Before the cyclic bending test, heat was transferred uniformly across the Ag NW-orthogonal mesh electrode film to reach a temperature of 50.9° C. Even after the cyclic bending test, there was a local increase in temperature due to the deformation of the PET substrate, but the change in the average temperature was rarely observed. Similarly, FIG. 16D and FIG. 17D show the thermal measurement images of the Ag NW-diagonal mesh electrode to which a voltage of 5.3 V was applied before and after the cyclic bending test. Before the repeated bending test, the Ag NW-diagonal mesh electrode film was uniformly heated to 49.9° C., and the change in the average temperature was rarely observed even after the cyclic bending test.

Figure 18A:
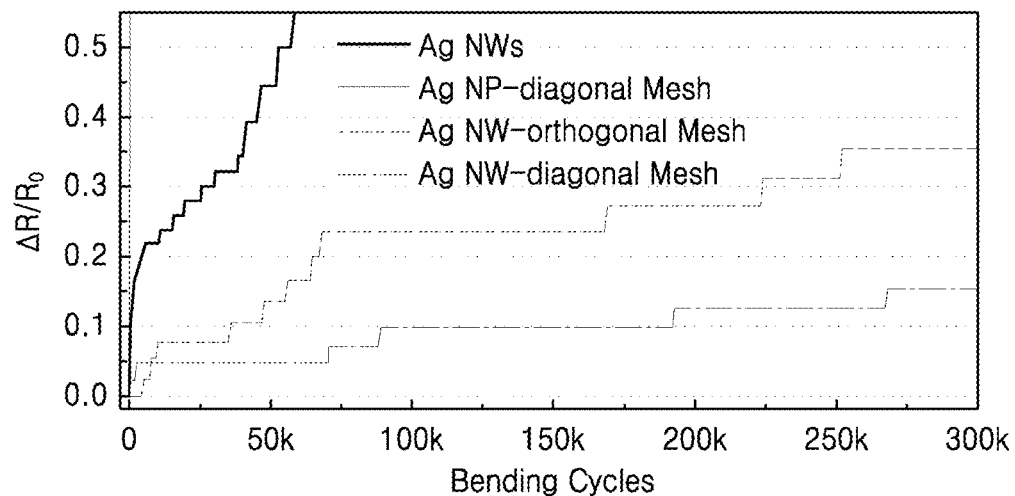
FIG. 18A to FIG. 18B present a graph showing the resistance change after a cyclic bending test for Pristine Ag NWs, Ag NP-mesh, and Ag NW-mesh electrodes according to Examples and Comparative Examples of the present invention and a graph showing the resistance change after a cyclic bending test for PU/Ag NWs, PU/Ag NP-mesh, and PU/Ag NW-mesh electrodes in which an overcoat layer has been formed.

FIG. 18A is a graph showing the resistance change after up to 300,000 cylces of cyclic bending test at an ROC of 1 mm for the pristine Ag NWs, Ag NP-mesh, Ag NW-orthogonal mesh, and Ag NW-diagonal mesh electrodes having the random network structure described above. First, the Ag NP-mesh showed very low bending durability in less than 1000 cycles of cyclic bending test, which confirmed that the existing metal-based nanoparticle-mesh had very poor durability under repeated bending at an extremely low radius of curvature. In the case of the pristine Ag NWs, the bending resistance was improved compared to the Ag NP-mesh due to the flexibility of the NWs itself. That is, the NWs had a very large contact area in relation to the number thereof compared to that of NPs, and the area bonded to a substrate in relation to the number of NWs was also greatly increased, and hence the $\Delta R/R_0$ was small. Finally, in the case of the Ag NW-orthogonal mesh and Ag NW-diagonal mesh, the repeated bending resistance was much greatly improved compared to that of the above two electrodes. In particular, in the case of the Ag NW-diagonal mesh at a line spacing of 30 µm, $\Delta R/R_{0,10\%}$ was observed up to 193,000 cycles in an environment of a 1 mm ROC. It was confirmed that the durability was greatly improved by the strong adhesion to the substrate by SLW, the strong bonding effect between the wires, the adjustment of the line spacing, and the change of the pattern direction.

Figure 18B:
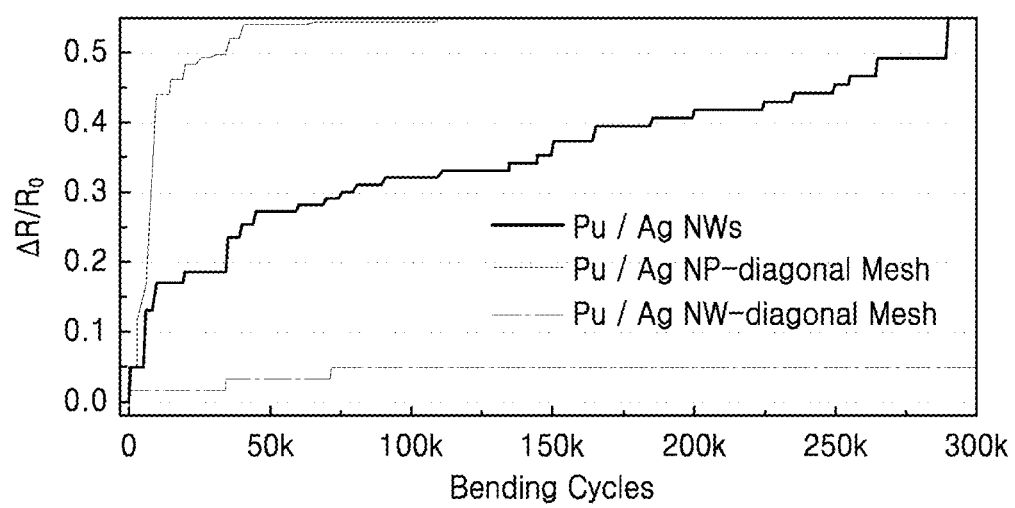

FIG. 18B shows results of the cyclic bending test performed after overcoating for covering a protective layer with polyurethane (PU) to achieve better mechanical bending durability. In the case of the Ag NW random network, the Ag NP-mesh, and the Ag NW-mesh described above, it can be seen that the banding durability was greatly improved after overcoating. In particular, in the case of the PU/Ag NW-mesh, it was confirmed that the $\Delta R/R_0$ was 5% or less even after 300,000 cycles of test, indicating that the fatigue durability was significantly improved.

Example 6

EMI shielding efficiency was measured using a two-port vector analyzer in the frequency range of 500 MHz to 18 GHz. An EMI shielding measurement kit designed according to standard ASTM D4935 was used together with a coaxial sample holder, and the inner and outer diameters of a sample were 12.2 mm and 2.1 mm, respectively. The total EMI shielding of a transparent electrode film is expressed by the following equations, where $SE_R$, $SE_A$, and $SE_{MR}$ represent reflection loss, absorption loss, and multiple reflection loss, respectively. In the case of multiple reflection, when the electrode film is a single layered thin film and $SE_A > 10$ dB, reflection loss may be neglected.

$$|S_{11}|^2 = R, |S_{21}|^2 = T, A + R + T = 1 \tag{6}$$

$$SE_{Total} = 20 \log\frac{|P_I|}{|P_T|} = SE_R + SE_A + SE_{MR} \cong SE_R + SE_A (dB) \tag{7}$$

$$SE_R = -10 \log(1 - R) \ (dB) \tag{8}$$

$$SE_A = -10 \log\frac{T}{1-R} (dB) \tag{9}$$

$$SE_{Total} = -10 \log(1 - R) - \log\left(\frac{T}{1-R}\right) \tag{10}$$

Figure 19A:
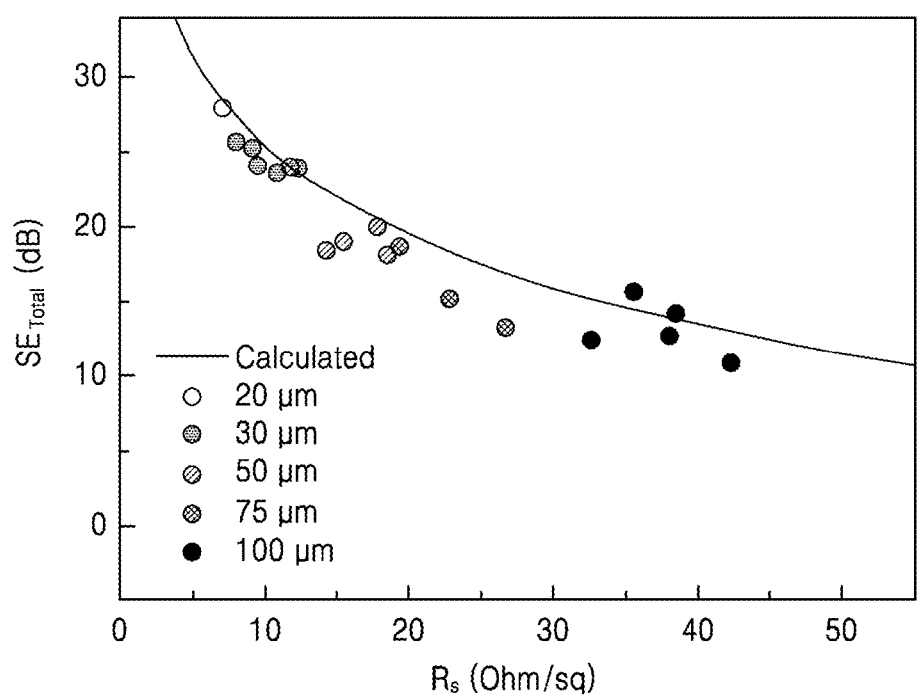
FIG. 19A to FIG. 19D presents graphs showing electromagnetic wave shielding efficiency values of electrodes according to an embodiment of the present invention and EMI efficiency values versus frequency before and after a repeated bending test.

FIG. 19A and Table 4 show the EMI shielding efficiency values of Ag NW-mesh fabricated via SLW. EMI shielding efficiency varies due to the difference in sheet resistance based on each line width and line spacing. The EMI shielding efficiency is calculated by Equation 11 below and shown as a solid line in the graph.

$$EMI = 20 \log\left(\frac{z_0}{2R_s}\right) \tag{11}$$

TABLE 4

| Line spacing (μm) | $R_s$ (Ω/□) | $T_{550}$ (%) | Calculated EMI SE (dB) | EMI SE Before cyclic-bending test (dB) | EMI SE After cyclic-bending test (dB) |
|---|---|---|---|---|---|
| 30 | 11.8 | 81.7 | 24.1 | 24.2 | 24.7 |
| 50 | 17.8 | 86.8 | 20.5 | 19.8 | 17.0 |
| 75 | 22.8 | 89.8 | 18.3 | 15.2 | 14.0 |
| 10 | 38.1 | 93.7 | 13.9 | 12.7 | 6.3 |

Here, $Z_0$ is the impedance (377Ω) of free space, and it was confirmed that the EMI shielding efficiency value according to each $R_S$ was consistent with the theoretical formula.

Figure 19B:
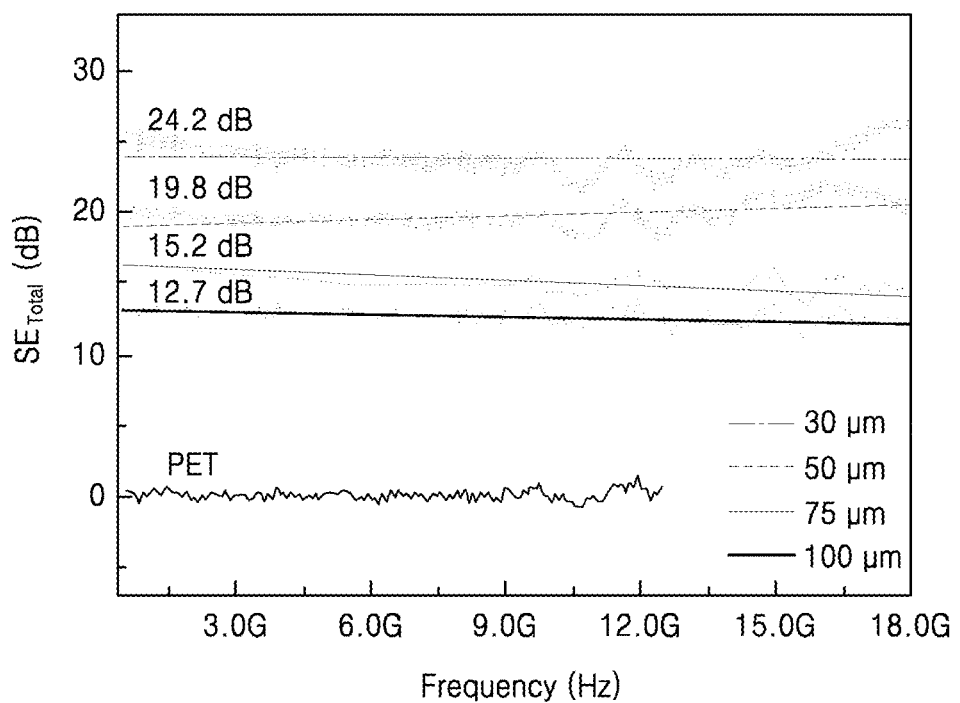
Figure 19C:
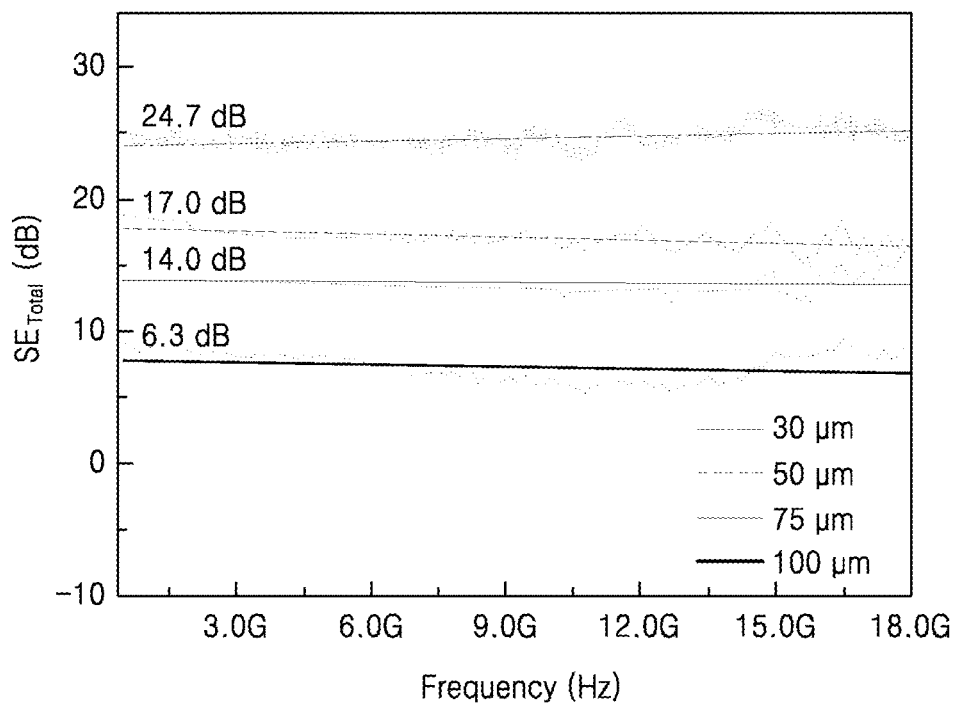
Figure 19D:
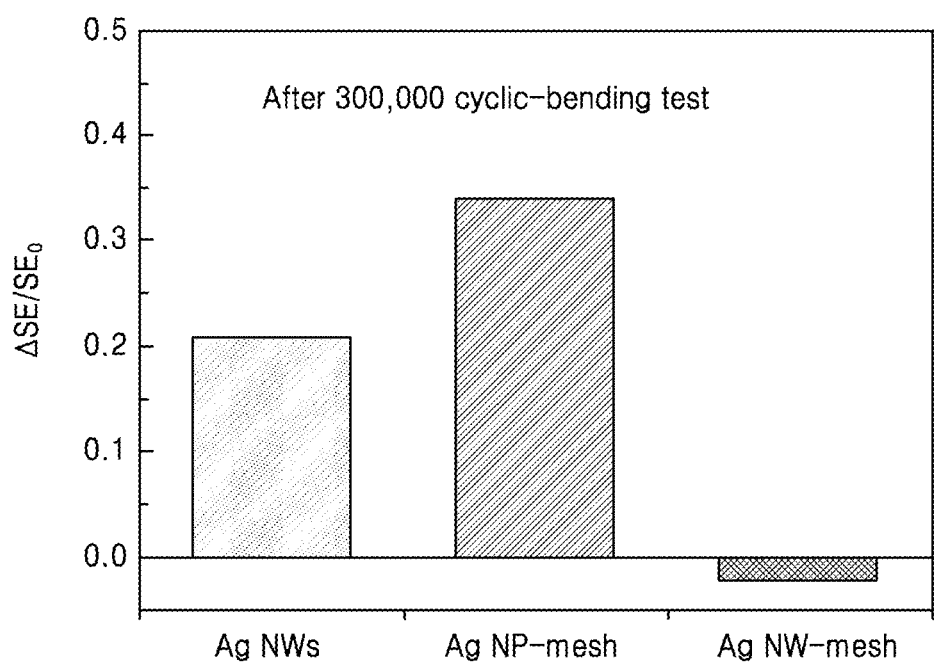

FIG. 19B and FIG. 19C are graphs showing the shielding efficiency before and after 300,000 cycles of cyclic bending test for Ag NW-mesh electrodes with varied line spacing in a frequency band of 500 MHz to 18 GHz. Each of the Ag NW-mesh electrodes before and after the bending test showed a linear constant value. In particular, in the Ag NW-mesh with a line spacing of 30 μm, the shielding efficiency remained almost unchanged even after 300,000 cycles of cyclic bending test. FIG. 19D shows changes in shielding efficiency of Ag NW, Ag NP-mesh, and Ag NW-mesh before and after the cyclic bending test. In the case of Ag NW and Ag NP-mesh, the shielding efficiency was greatly reduced due to the increase in resistance caused by damage to the electrode after 300,000 cycles, but it was confirmed that there was little change in the shielding efficiency of Ag NW-mesh.

In the above-described embodiment and Examples of the present invention, an Ag NW-mesh electrode film was fabricated by SLW, and electrical, optical, and mechanical properties were compared under cyclic bending fatigue conditions. Ag NP-mesh, which is a typical mesh electrode, retains the tendency of metal mesh reported previously, whereas Ag NW exhibits a different tendency due to the presence of nanowires inside the mesh line. Repeated bending characteristics may be adjusted by modifying a mesh pattern or adjusting a line spacing, and the improvement of performance was more pronounced when the diagonal pattern was formed and the line spacing was narrower. In addition, in the formation of Ag NW-mesh, as AMD increased from 88.5 mg/m² to 126.2 mg/m², the repeated bending characteristics were improved. In particular, a resistance change value of the Ag NW-mesh electrode film with a diagonal pattern having a line width of 30 μm remained unchanged even after 193,000 cycles of cyclic bending at an ROC of 1 mm. In addition, a value of the PU/Ag NW-mesh electrode in the diagonal pattern direction fabricated by forming a protective layer of polyurethane showed a resistance change of less than 10% even after 300,000 cycles at an ROC of 1 mm. Therefore, the Ag NW-mesh electrode according to an embodiment of the present invention provides excellent electrical properties, light transmittance, EMI SE, and bending durability and is thus suitable to be applied to foldable and rollable devices exposed to repeated bending fatigue.

According to the embodiment of the present described above, nanowires are welded by a very fast laser beam, so that the substrate may not be damaged at all. In addition, a pattern shape, line width, and line spacing may be easily adjusted in a non-contact manner, and fabrication is possible at relatively fast rate. In other words, it is possible to easily adjust the surface resistance and optical transmittance by adjusting the line width and line spacing, which are the advantages of the existing mesh-based electrode technologies, and maintain high bending durability by increasing the number of networking points of individual metal nanowires. In addition, it is possible to prevent the electrode from cracking by changing the mesh pattern to effectively suppress the bending stress.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A silver nanowire-mesh (Ag NW-mesh) electrode comprising:
 a flexible substrate; and
 a mesh pattern layer which is disposed on the flexible substrate and in which a plurality of first metal lines and a plurality of second metal lines are composed of Ag NWs and intersect each other in an orthogonal or diagonal direction to form a grid pattern, wherein the first metal lines and the second metal lines of the mesh pattern layer form an angle of any one of 35 degrees to 55 degrees, 125 degrees to 145 degrees, 215 degrees to 235 degrees and 305 degrees to 325 degrees with respect to a bending direction of the first metal lines and the second metal lines.

2. The Ag NW-mesh electrode of claim 1, wherein the first metal lines and the second metal lines are metal lines having the same line width and have a line width in the range of 8 μm to 14 μm.

3. The Ag NW-mesh electrode of claim 2, wherein the first metal lines and the second metal lines have a line width in the range of 9 μm to 10 μm.

4. The Ag NW-mesh electrode of claim 1, further comprising a polyurethane (PU) overcoat layer formed on the mesh pattern layer.

5. The Ag NW-mesh electrode of claim 1, wherein, in the mesh pattern layer, the Ag NWs are bonded via selective laser welding to form a network.

6. The Ag NW-mesh electrode of claim 1, wherein in the mesh pattern layer, the plurality of first metal lines are arranged in parallel to each other at the same interval and the plurality of second metal lines are arranged in parallel to each other at the same interval.

7. The Ag NW-mesh electrode of claim 1, wherein the flexible substrate is a substrate of one polymer selected from a group consisting of polyimide (PI), polyethylene terephthalate (PET), polyethylene naphthalate (PEN), polyethersulfone (PES), nylon, polytetrafluoroethylene (PTFE), polyetheretherketone (PEEK), polycarbonate (PC), polyurethane (PU), and polyarylate (PAR).

8. The Ag NW-mesh electrode of claim 1, wherein the first metal lines and the second metal lines have an area mass density (AMD) in the range of 70 mg/m$^2$ to 130 mg/m$^2$.

9. A transparent electromagnetic wave shielding film comprising the Ag NW-mesh electrode of claim 1.

10. A transparent heater comprising the Ag NW-mesh electrode of claim 1.

11. The Ag NW-mesh electrode of claim 1, wherein the Ag NW-mesh electrode is bent.

12. The Ag NW-mesh electrode of claim 11, wherein the first metal lines and the second metal lines of the mesh pattern layer form the angle of 35 degrees to 55 degrees with respect to the bending direction of the first metal lines and the second metal lines.

13. The Ag NW-mesh electrode of claim 11, wherein the first metal lines and the second metal lines of the mesh pattern layer form the angle of 125 degrees to 145 degrees with respect to the bending direction of the first metal lines and the second metal lines.

14. The Ag NW-mesh electrode of claim 11, wherein the first metal lines and the second metal lines of the mesh pattern layer form the angle of 215 degrees to 235 degrees with respect to the bending direction of the first metal lines and the second metal lines.

15. The Ag NW-mesh electrode of claim 11, wherein the first metal lines and the second metal lines of the mesh pattern layer form the angle of 305 degrees to 325 degrees with respect to the bending direction of the first metal lines and the second metal lines.

* * * * *